(12) United States Patent
Lin

(10) Patent No.: US 9,653,445 B2
(45) Date of Patent: May 16, 2017

(54) SEMICONDUCTOR DEVICE AND METHOD OF FABRICATING 3D PACKAGE WITH SHORT CYCLE TIME AND HIGH YIELD

(71) Applicant: STATS ChipPAC, Ltd., Singapore (SG)

(72) Inventor: Yaojian Lin, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 14/887,561

(22) Filed: Oct. 20, 2015

(65) Prior Publication Data

US 2016/0118332 A1 Apr. 28, 2016

Related U.S. Application Data

(60) Provisional application No. 62/068,499, filed on Oct. 24, 2014.

(51) Int. Cl.
  *H01L 23/528* (2006.01)
  *H01L 21/66* (2006.01)
  (Continued)

(52) U.S. Cl.
  CPC ............ *H01L 25/50* (2013.01); *H01L 21/486* (2013.01); *H01L 21/78* (2013.01); *H01L 22/20* (2013.01); *H01L 23/49822* (2013.01); *H01L 23/49827* (2013.01); *H01L 23/5389* (2013.01); *H01L 25/16* (2013.01); *H01L 21/561* (2013.01); *H01L 22/14* (2013.01); *H01L 23/3128* (2013.01);
  (Continued)

(58) Field of Classification Search
  CPC ... H01L 22/20; H01L 21/76895; H01L 21/78; H01L 25/16; H01L 25/50; H01L 23/49822; H01L 23/49827; H01L 21/486; H01L 23/5389; H01L 23/3128; H01L 2224/16225; H01L 23/49816; H01L 21/561
  USPC ............................................. 438/15; 257/773
  See application file for complete search history.

(56) References Cited

U.S. PATENT DOCUMENTS 9,224,697 B1 12/2015 Kwon et al.
2003/0148558 A1* 8/2003 Kubo ................ H01L 21/76838
                                                    438/128
(Continued)

*Primary Examiner* — Walter H Swanson
(74) *Attorney, Agent, or Firm* — Robert D. Atkins; Patent Law Group: Atkins and Associates, P.C.

(57) ABSTRACT

A method of making a semiconductor device comprises the steps of providing a first manufacturing line, providing a second manufacturing line, and forming a first redistribution interconnect structure using the first manufacturing line while simultaneously forming a second redistribution interconnect structure using the second manufacturing line. The method further includes the steps of testing a first unit of the first redistribution interconnect structure to determine a first known good unit (KGU), disposing a known good semiconductor die (KGD) over the first KGU of the first redistribution interconnect structure, testing a unit of the second redistribution interconnect structure to determine a second known good unit (KGU, and disposing the second KGU of the second redistribution interconnect structure over the first KGU of the first redistribution interconnect structure and the KGD. A resolution of the second manufacturing line is greater than a resolution of the first manufacturing line.

21 Claims, 19 Drawing Sheets

(51) Int. Cl.
*H01L 21/768* (2006.01)
*H01L 21/78* (2006.01)
*H01L 25/00* (2006.01)
*H01L 25/16* (2006.01)
*H01L 21/48* (2006.01)
*H01L 23/538* (2006.01)
H01L 23/498 (2006.01)
H01L 23/31 (2006.01)
H01L 21/56 (2006.01)

(52) U.S. Cl.
CPC ............... *H01L 23/49816* (2013.01); *H01L 2224/16225* (2013.01)

(56) References Cited

U.S. PATENT DOCUMENTS

| | | | |
|---|---|---|---|
| 2013/0068516 A1* | 3/2013 | Mohammed | H01L 23/13 174/261 |
| 2014/0048906 A1* | 2/2014 | Shim | H01L 23/481 257/531 |
| 2016/0086863 A1 | 3/2016 | Won et al. | |

\* cited by examiner

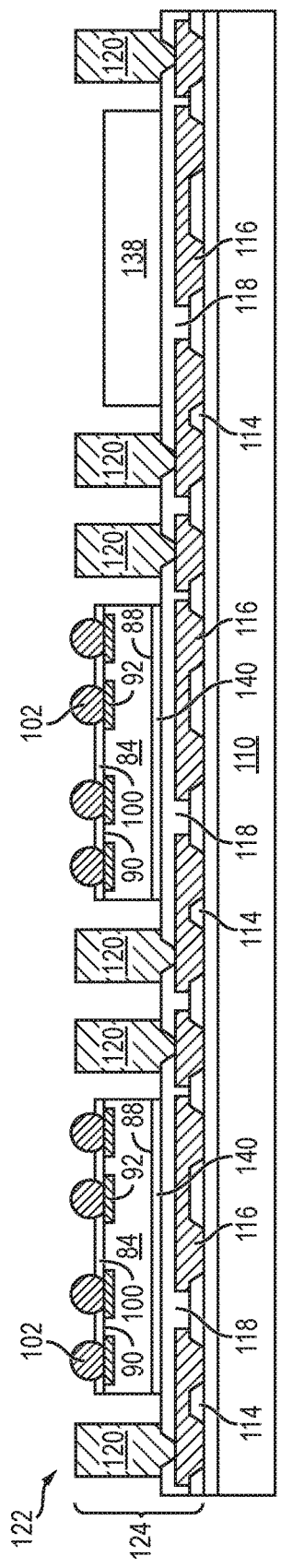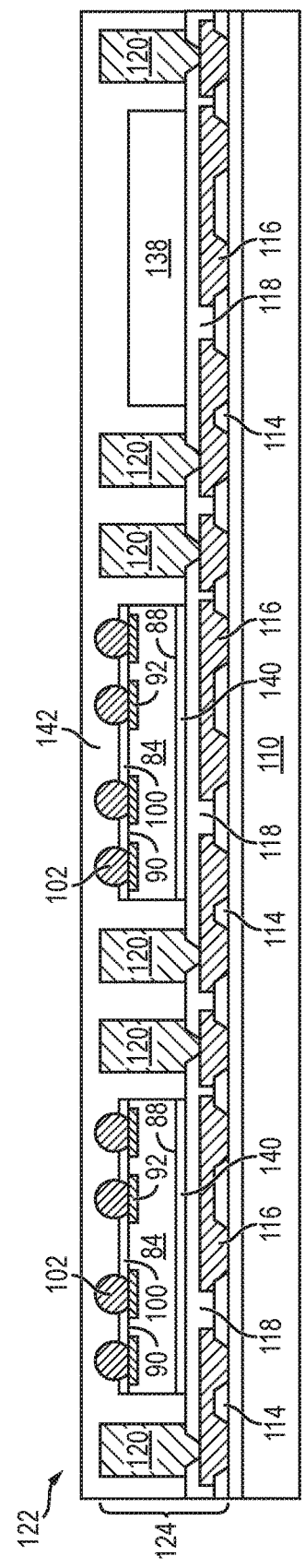
FIG. 3d
FIG. 3e

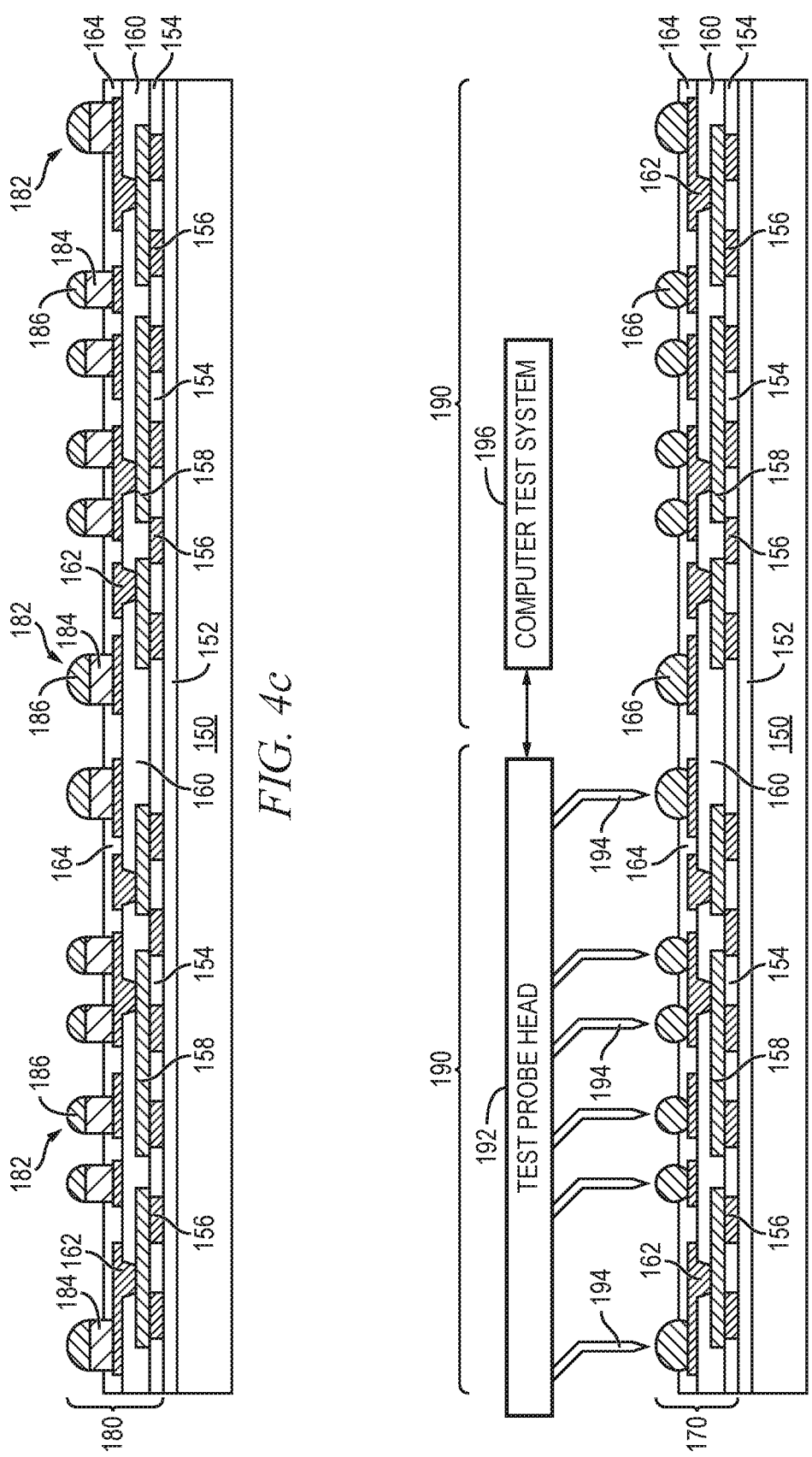

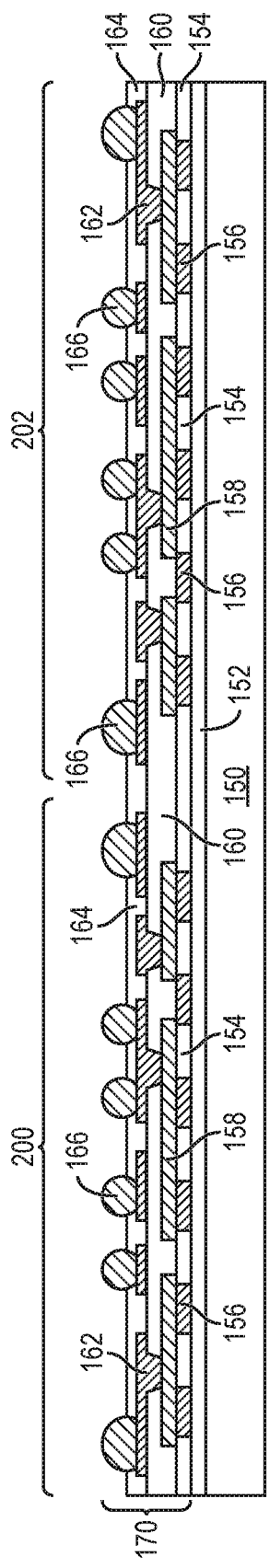
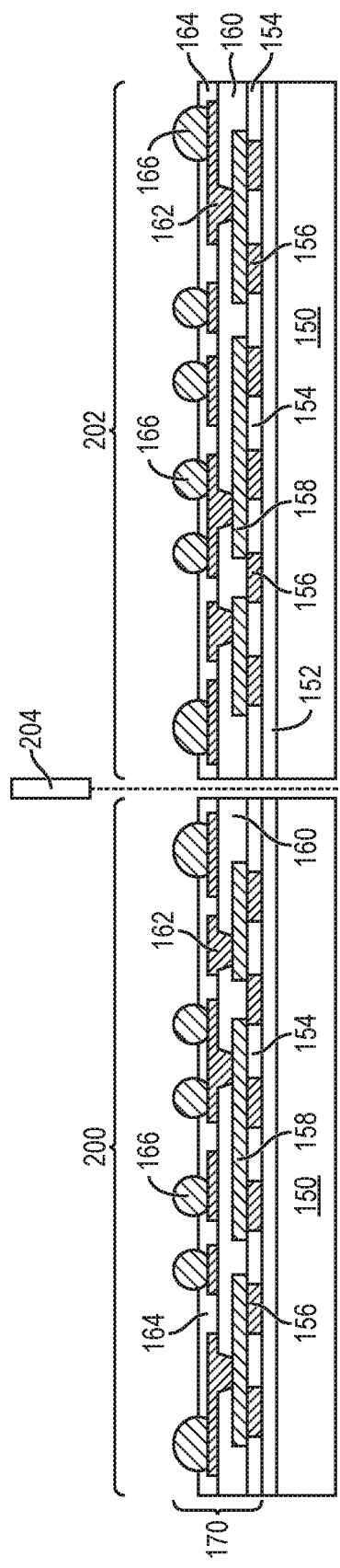
FIG. 5a
FIG. 5b

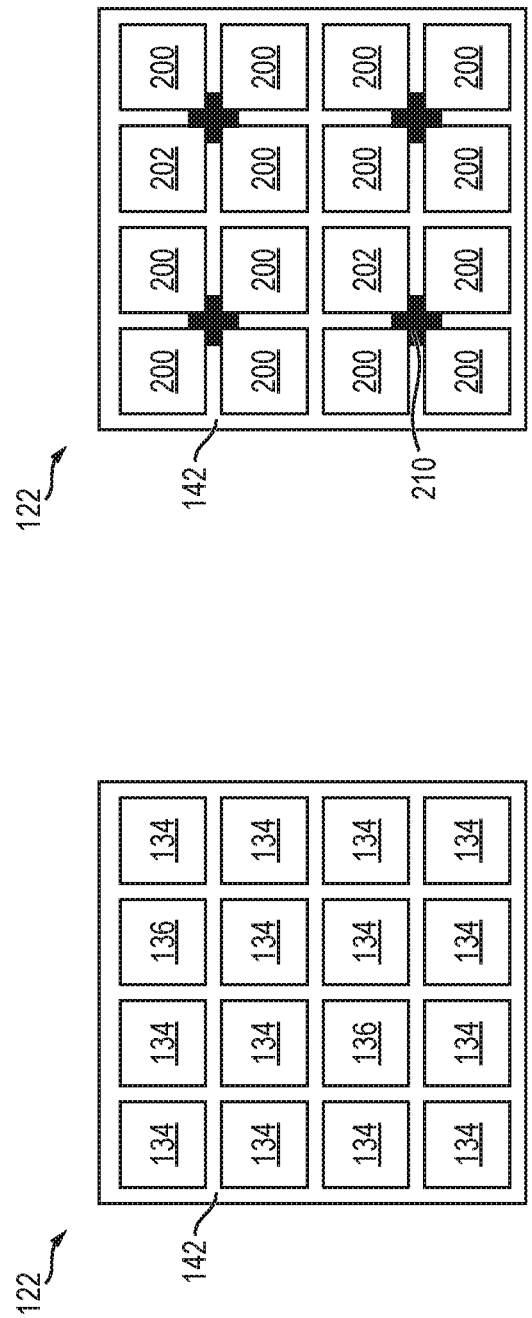

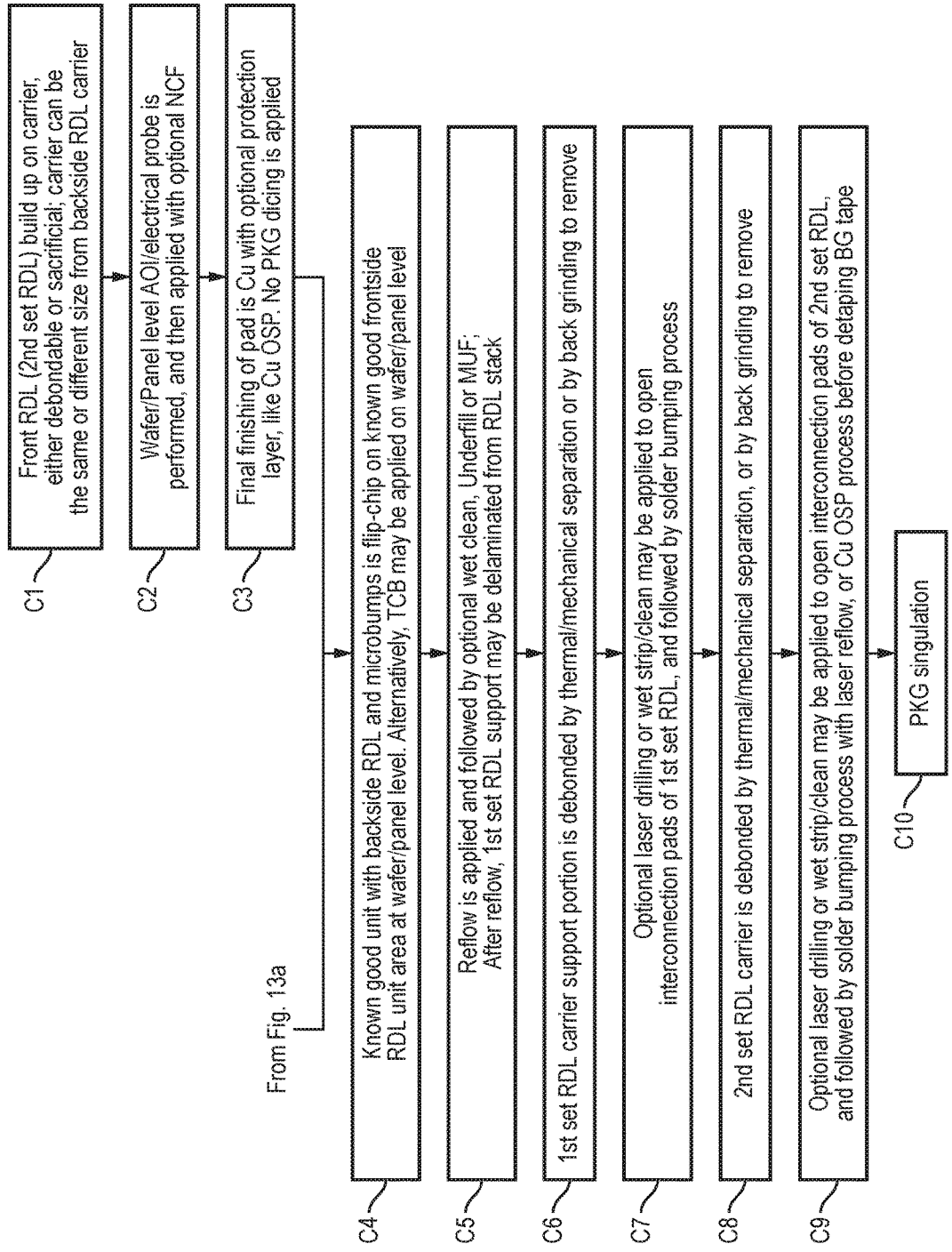

SEMICONDUCTOR DEVICE AND METHOD OF FABRICATING 3D PACKAGE WITH SHORT CYCLE TIME AND HIGH YIELD

CLAIM OF DOMESTIC PRIORITY

The present application claims the benefit of U.S. Provisional Application No. 62/068,499, filed Oct. 24, 2014, which application is incorporated herein by reference.

FIELD OF THE INVENTION

The present invention relates in general to semiconductor devices and, more particularly, to a semiconductor device and method of forming a wafer level package with the ability to fan-out signals on both an upper and a lower surface of the wafer level package while reducing cycle time and increasing yield.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support, electrical interconnect, and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A semiconductor die can be tested to be a known good die (KGD) prior to mounting in a semiconductor package, e.g., a fan-out wafer level chip scale package (Fo-WLCSP). The semiconductor package can still fail due to defects in the build-up interconnect structure, causing loss of the KGD. A semiconductor package size greater than 10 by 10 millimeter (mm) with fine line spacing and multilayer structures is particularly susceptible to defects in the build-up interconnect structure.

One approach to achieving the objectives of greater integration and smaller semiconductor devices is to focus on three-dimensional (3D) packaging technologies including package-on-package (PoP). The manufacturing of smaller semiconductor devices relies on implementing improvements to horizontal and vertical electrical interconnection between multiple semiconductor devices on multiple levels, i.e., 3D device integration. A reduced package profile is of particular importance for packaging in the cellular or smart phone industry. However, PoP devices often require laser drilling to form vertical interconnect structures, e.g., through mold vias, which increases equipment costs and requires drilling through an entire package thickness. Laser drilling increases cycle time (CT) and decreases manufacturing throughput. Vertical interconnections formed exclusively by a laser drilling process can result in reduced control and design flexibility. Furthermore, conductive materials used for forming through mold vias within a PoP, can be incidentally transferred to semiconductor die during package formation, thereby contaminating the semiconductor die within the package.

Additionally, electrical connection between stacked semiconductor devices often requires top and bottom side redistribution layers (RDLs) to be formed over opposing surfaces of the semiconductor die. In the manufacture of semiconductor packages having top and bottom side RDLs, semiconductor die are often mounted to a first temporary carrier and an encapsulant is deposited over the semiconductor die and first carrier to form a reconstituted wafer. A bottom side redistribution interconnect structure is formed over the semiconductor die and encapsulant. The workpiece is inverted and mounted to a second temporary carrier. The first temporary carrier is then removed. A top side redistribution interconnect structure is formed over the semiconductor die and encapsulant. The first temporary carrier is then removed. The reconstituted wafer is bumped and diced. However, flaws in the manufacturing process of either the topside redistribution interconnect structure or bottom side redistribution interconnect structure reduce yield and cause loss of KGD. Additionally, the cycle time of known methods of manufacture of semiconductor packages having top and bottom side RDLs is too long to support today's demands to fulfill customer orders with minimal inventory. Maintaining inventory causes waste as stored inventory rapidly becomes un-sellable out of date product.

SUMMARY OF THE INVENTION

A need exists to fabricate 3D semiconductor packages with short CT and high yield. Accordingly, in one embodiment, the present invention is a method of making a semiconductor device comprising the steps of providing a first manufacturing line, providing a second manufacturing line, and forming a first redistribution interconnect structure using the first manufacturing line while simultaneously forming a second redistribution interconnect structure using the second manufacturing line. The method further includes the steps of testing a first unit of the first redistribution interconnect structure to determine a first known good unit (KGU), disposing a known good semiconductor die (KGD) over the first KGU of the first redistribution interconnect structure, testing a unit of the second redistribution interconnect structure to determine a second known good unit (KGU), and disposing the second KGU of the second redistribution interconnect structure over the first KGU of the first redistribution interconnect structure and the KGD.

In another embodiment, the present invention is a method of making a semiconductor device comprising the steps of providing a first manufacturing line, providing a second manufacturing line, forming a first redistribution interconnect structure using the first manufacturing line while simultaneously forming a second redistribution interconnect structure using the second manufacturing line, testing a first unit of the first redistribution interconnect structure to determine a first known good unit (KGU), and disposing a known good semiconductor die (KGD) over the first KGU of the first redistribution interconnect structure.

In another embodiment, the present invention is a method of making a semiconductor device comprising the step of forming a first redistribution interconnect structure using a first manufacturing line while simultaneously forming a second redistribution interconnect structure using a second manufacturing line.

In another embodiment, the present invention is a semiconductor device comprising a first redistribution interconnect structure including a known good unit (KGU) of the first redistribution interconnect structure and a rejected unit of the first redistribution interconnect structure. A known good die (KGD) is disposed over the KGU of the first redistribution interconnect structure. A dummy die is disposed over the rejected unit of the first redistribution interconnect structure.

BRIEF DESCRIPTION OF THE DRAWINGS

FIGS. 3a-3f illustrate a process of forming a semiconductor device including a bottom side redistribution interconnect structure;

FIGS. 4a-4d illustrate a process of forming a top side redistribution interconnect structure over a carrier for testing at interim stages;

FIGS. 5a-5i illustrate a process of forming a 3D fan-out dual side RDL WLCSP;

FIGS. 13a-13b illustrate another process of forming a 3D fan-out dual side RDL WLCSP.

DETAILED DESCRIPTION OF THE DRAWINGS

Figure 1:
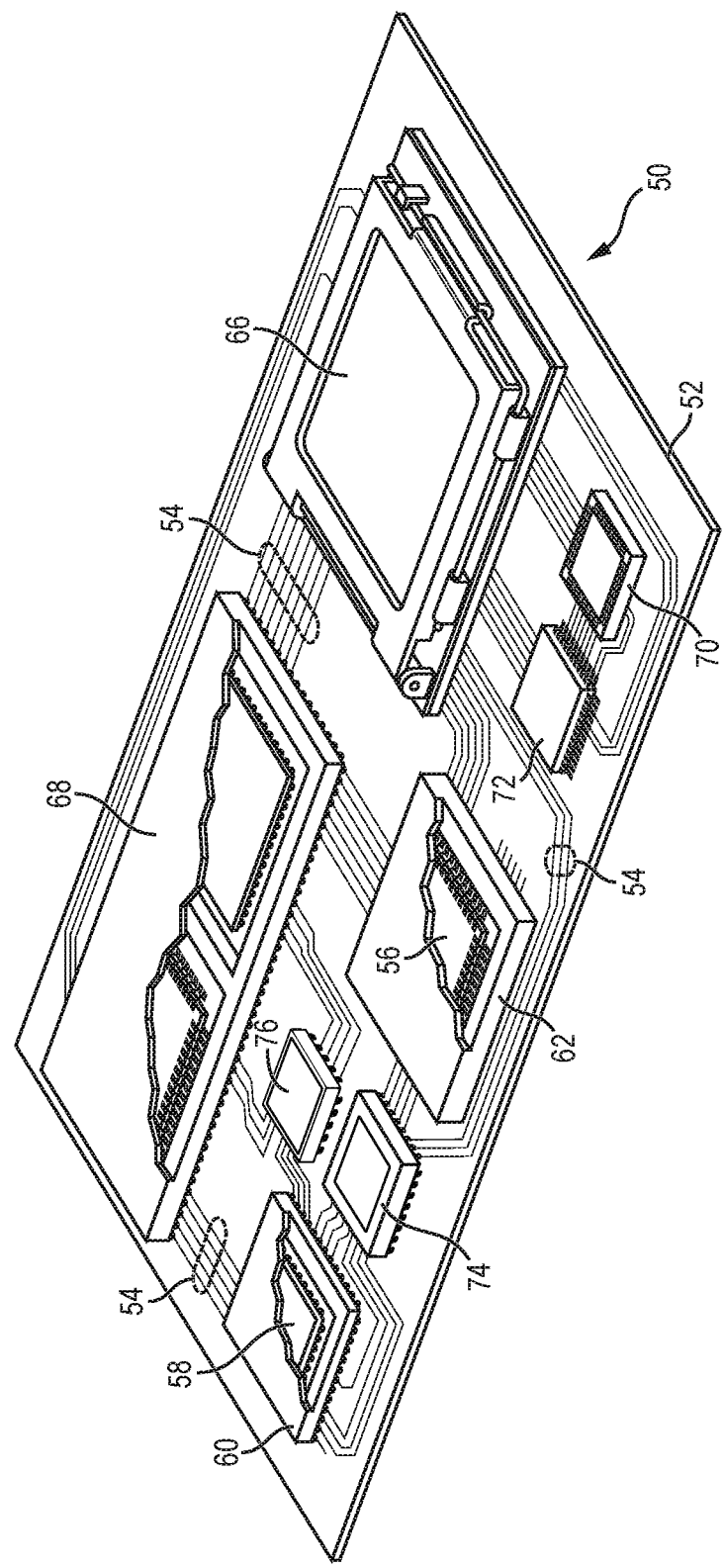
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as may be included within the spirit and scope of the invention as defined by the appended claims and claims equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser-cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other signal processing card that can be inserted into a computer. The semiconductor package can include microprocessors, memories, application specific integrated circuits (ASIC), microelectromechanical systems (MEMS), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. In one embodiment, eWLB 74 is a fan-out wafer level package (Fo-WLP) and WLCSP 76 is a fan-in wafer level package (Fi-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
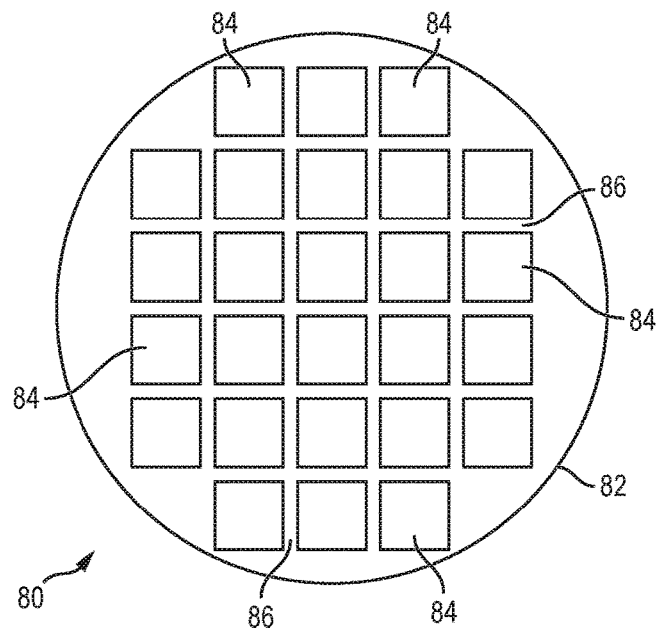
FIGS. 2a-2e illustrate a semiconductor wafer with a plurality of semiconductor die separated by a saw street.

FIG. 2a shows a semiconductor wafer 80 with a base substrate material 82, such as silicon, germanium, aluminum phosphide, aluminum arsenide, gallium arsenide, gallium nitride, indium phosphide, silicon carbide, or other bulk semiconductor material for structural support. A plurality of semiconductor die or components 84 is formed on wafer 80 separated by a non-active, inter-die wafer area or saw street 86 as described above. Saw street 86 provides cutting areas to singulate semiconductor wafer 80 into individual semiconductor die 84. In one embodiment, semiconductor wafer 80 has a width or diameter of 100-450 mm.

Figure 2B:
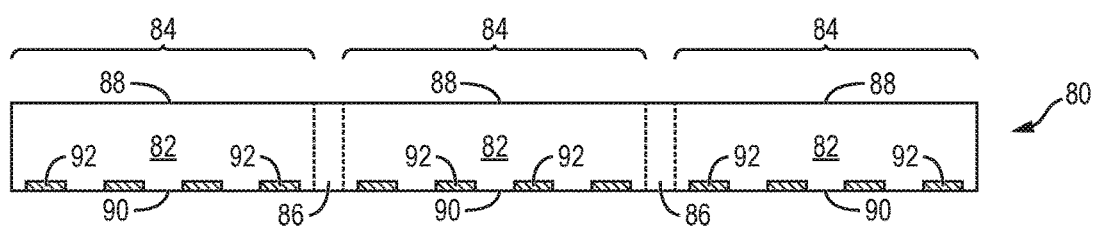

FIG. 2b shows a cross-sectional view of a portion of semiconductor wafer 80. Each semiconductor die 84 has a back or non-active surface 88 and an active surface 90 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 90 to implement analog circuits or digital circuits, such as digital signal processor (DSP), ASIC, MEMS, memory, or other signal processing circuit. In one embodiment, active surface 90 contains a MEMS, such as an accelerometer, gyroscope, strain gauge, microphone, or other sensor responsive to various external stimuli.

An electrically conductive layer 92 is formed over active surface 90 of semiconductor die 84 using PVD, CVD, electrolytic plating, electroless plating process, or other suitable metal deposition process. Conductive layer 92 includes one or more layers of aluminum (Al), copper (Cu), tin (Sn), nickel (Ni), gold (Au), silver (Ag), or other suitable electrically conductive material or combination thereof. Conductive layer 92 operates as contact pads electrically connected to the circuits on active surface 90. Conductive layer 92 is formed as contact pads disposed side-by-side a first distance from the edge of semiconductor die 84, as shown in FIG. 2b. Alternatively, conductive layer 92 is formed as contact pads that are offset in multiple rows such that a first row of contact pads is disposed a first distance from the edge of the die, and a second row of contact pads alternating with the first row is disposed a second distance from the edge of the die. In one embodiment, back surface 88 of semiconductor wafer 80 undergoes an optional back-grinding operation with a grinder or other suitable mechanical or etching process to remove a portion of base substrate material 82 and reduce the thickness of semiconductor wafer 80 including semiconductor die 84.

Semiconductor wafer 80 undergoes electrical testing and inspection as part of a quality control process. Manual visual inspection and automated optical systems are used to perform inspections on semiconductor wafer 80. Software can be used in the automated optical analysis of semiconductor wafer 80. Visual inspection methods may employ equipment such as a scanning electron microscope, high-intensity or ultra-violet light, or metallurgical microscope. Semiconductor wafer 80 is inspected for structural characteristics including warpage, thickness variation, surface particulates, irregularities, cracks, delamination, and discoloration.

Figure 2C:
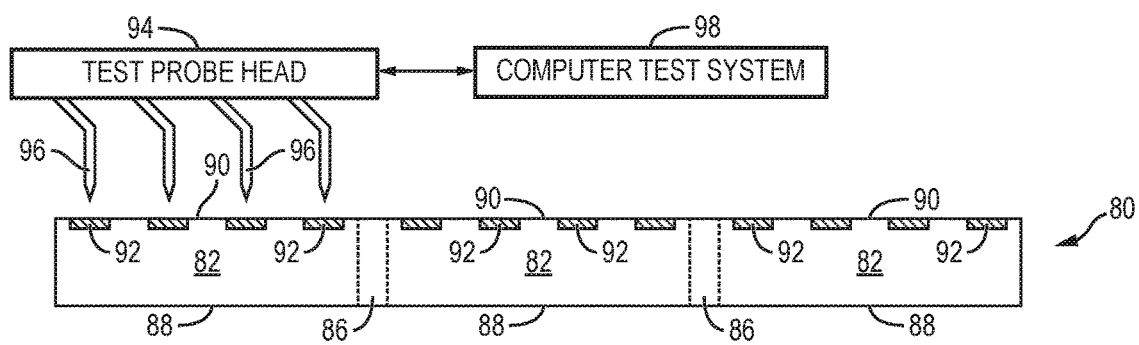

The active and passive components within semiconductor die 84 undergo testing at the wafer level for electrical performance and circuit function. Each semiconductor die 84 is tested for functionality and electrical parameters, as shown in FIG. 2c, using a test probe head 94 including a plurality of probes or test leads 96, or other testing device. Probes 96 are used to make electrical contact with nodes or conductive layer 92 on each semiconductor die 84 and provide electrical stimuli to the contact pads. Semiconductor die 84 responds to the electrical stimuli, which is measured by computer test system 98 and compared to an expected response to test functionality of the semiconductor die. The electrical tests may include circuit functionality, lead integrity, resistivity, continuity, reliability, junction depth, electro-static discharge (ESD), RF performance, drive current, threshold current, leakage current, and operational parameters specific to the component type. The inspection and electrical testing of semiconductor wafer 80 enables semiconductor die 84 that pass to be designated as KGD for use in a semiconductor package. Semiconductor die that fail the inspection and electrical testing are designated as rejected die.

Figure 2D:
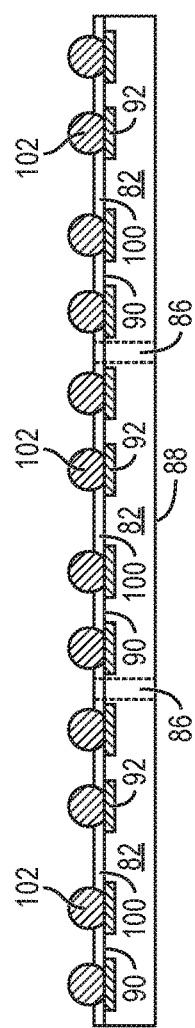

In FIG. 2d, an insulating or passivation layer 100 is formed over active surface 90 of semiconductor wafer 80 and contact pads 92 using PVD, CVD, printing, spin coating, spray coating, sintering or thermal oxidation. The insulating layer 100 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties. A portion of insulating layer 100 is removed by an etching process to expose contact pads 92.

An electrically conductive bump material is deposited over conductive layer 92 using an evaporation, electrolytic plating, electroless plating, ball drop, or screen printing process. The bump material can be Al, Sn, Ni, Au, Ag, lead (Pb), Bismuth (Bi), Cu, solder, and combinations thereof, with an optional flux solution. For example, the bump material can be eutectic Sn/Pb, high-lead solder, or lead-free solder. The bump material is bonded to conductive layer 92 using a suitable attachment or bonding process. In one embodiment, the bump material is reflowed by heating the material above its melting point to form spherical balls or bumps 102. In some applications, bumps 102 are reflowed a second time to improve electrical contact to conductive layer 92. In one embodiment, bumps 102 are formed over an under bump metallization (UBM) having a wetting layer, barrier layer, and adhesive layer. The bumps can also be compression bonded or thermocompression bonded to conductive layer 92. Bumps 102 represent one type of interconnect structure that can be formed over conductive layer 92. The interconnect structure can also use bond wires, conductive paste, stud bump, micro bump, or other electrical interconnect.

Figure 2E:
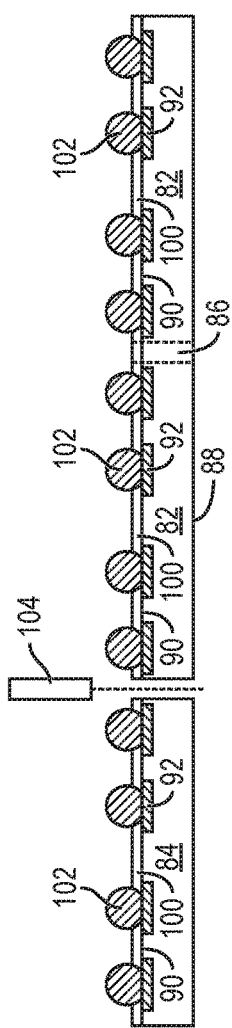

In FIG. 2e, semiconductor wafer 80 is singulated through saw street 86 using a saw blade or laser-cutting tool 104 into individual semiconductor die 84. Individual semiconductor die 84 can be inspected and electrically tested for identification of KGD post singulation. Rejected die, i.e., semiconductor die that fail the inspection and electrical testing are discarded after singulation leaving only KGD 84 for further processing.

Figure 3A:
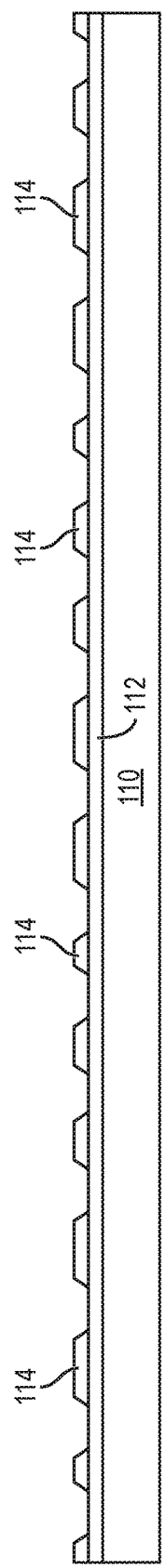

FIGS. 3a-5i illustrate, in relation to FIG. 1, a method of forming a 3D semiconductor package with short cycle time and high yield. FIG. 3a shows a cross-sectional view of a portion of a carrier or temporary substrate 110 containing sacrificial base material such as silicon, polymer, beryllium oxide, glass, or other suitable low-cost, rigid material for structural support. An interface layer or double-sided tape 112 is formed over carrier 110 as a temporary adhesive bonding film, etch-stop layer, or thermal release layer.

Carrier 110 can be a round or rectangular panel (greater than 300 mm) with capacity for multiple semiconductor die 84. Carrier 110 may have a larger surface area than the surface area of semiconductor wafer 80. A larger carrier reduces the manufacturing cost of the semiconductor package as more components or semiconductor die can be processed on the larger carrier thereby reducing the cost per unit. Semiconductor packaging and processing equipment are designed and configured for the size of the wafer or carrier being processed.

To further reduce manufacturing costs, the size of carrier 110 is selected independent of the size of semiconductor die 84 or semiconductor wafer 80. That is, carrier 110 has a fixed or standardized size, which can accommodate various size semiconductor die 84 singulated from one or more semiconductor wafers 80. In one embodiment, carrier 110 is circular with a diameter of 330 mm. In another embodiment, carrier 110 is rectangular with a width of 560 mm and length of 600 mm. Semiconductor die 84 may have dimensions of 10 mm by 10 mm, which are placed on the standardized carrier 110. Alternatively, semiconductor die 84 may have dimensions of 20 mm by 20 mm, which are placed on the same standardized carrier 110. Accordingly, standardized carrier 110 can handle any size of semiconductor die 84, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 110 lowers manufacturing costs and capital risk by reducing or eliminating the need for specialized semiconductor processing lines based on die size or incoming wafer size. By selecting a predetermined carrier size to use for any size component or semiconductor die from all semiconductor wafer sizes, a flexible manufacturing line can be implemented.

To further reduce manufacturing costs, a method of fabricating 3D semiconductor packages with short CT and high yield is utilized. The top and bottom side redistribution interconnect structures to be disposed over opposing surfaces of semiconductor die 84 are analyzed and compared to existing technology nodes or manufacturing lines. The top and bottom side redistribution interconnect structures are each assigned to a different manufacturing line to maximize the efficiency and cost infrastructure of the technology nodes of panel level RDL build-up and packaging. Accordingly, the bottom side redistribution interconnect structure is fabricated on a first manufacturing line at the same time, i.e., simultaneously, as the top side redistribution interconnect structure is being fabricated on a second manufacturing line, greatly reducing CT.

Figure 3B:
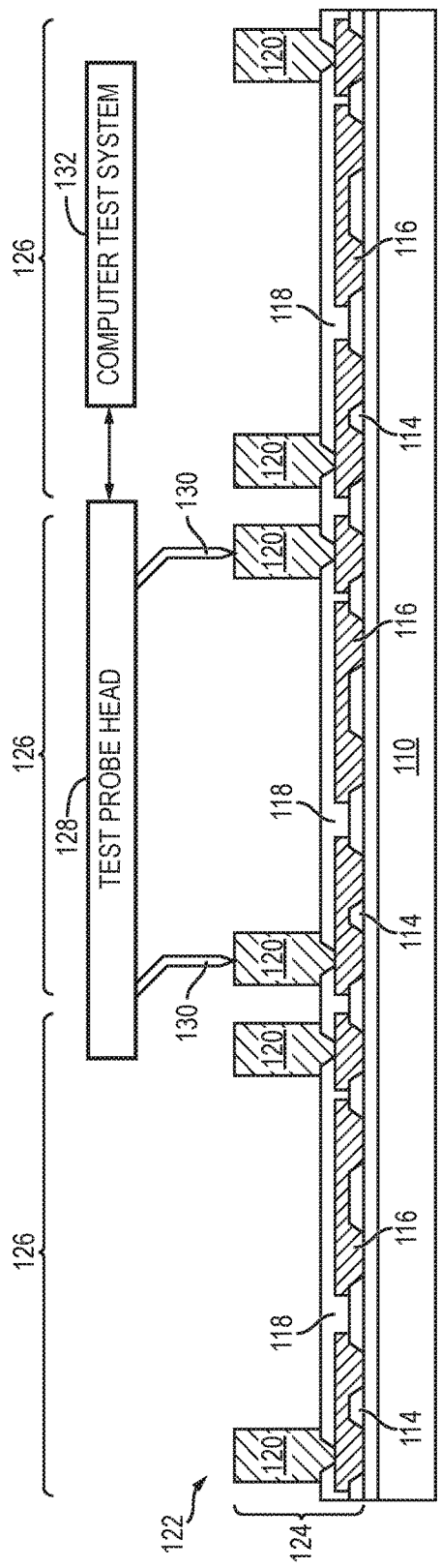

In FIGS. 3a-3b, a build-up interconnect structure 124 is formed over standardized carrier 110 and interface layer 112. Bottom side build-up interconnect structure 124 includes an insulating or passivation layer 114 formed over standardized carrier 110 and interface layer 112 using PVD, CVD, printing, spin coating, spray coating, sintering or thermal oxidation. The insulating layer 114 contains one or more layers of SiO2, Si3N4, SiON, Ta2O5, Al2O3, or other material having similar insulating and structural properties. A portion of insulating layer 114 is removed by an etching process to expose portions of interface layer 112.

FIG. 3b shows an electrically conductive layer or RDL 116 formed using a patterning and metal deposition process such as sputtering, electrolytic plating, and electroless plating. Conductive layer 116 can be one or more layers of Al, Cu, Sn, Ni, Au, Ag, or other suitable electrically conductive material. Portions of conductive layer 116 can be electrically common or electrically isolated depending on the design and function of the final semiconductor package. Bottom side redistribution interconnect structure 124 further includes an insulating or passivation layer 118 formed between conductive layers 116 for electrical isolation. Insulating layer 118 contains one or more layers of SiO2, Si3N4, SiON, Ta2O5, Al2O3, or other material having similar insulating and structural properties. Insulating layer 118 is formed using PVD, CVD, printing, spin coating, spray coating, sintering or thermal oxidation. A portion of insulating layer 118 is removed by an etching process to expose conductive layer 116 for bump formation or additional package interconnect. In one embodiment, bottom side redistribution interconnect structure 124 further includes one or more additional conductive layers and additional insulating or passivation layers.

An electrically conductive material is deposited over conductive layer 116 using an evaporation, electrolytic plating, electroless plating, ball drop, or screen printing process. The conductive material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The conductive material is bonded to conductive layer 116 using a suitable attachment or bonding process. In one embodiment, the conductive material is formed into conductive pillars 120. In another embodiment, the conductive material is reflowed by heating the material above its melting point to form spherical balls or bumps 120. In some applications, bumps 120 are reflowed a second time to improve electrical contact to conductive layer 116. In one embodiment, the conductive material is formed over a UBM having a wetting layer, barrier layer, and adhesive layer. Conductive pillars 120 can also be compression bonded or thermocompression bonded to conductive layer 116. Conductive pillars 120 represent one type of interconnect structure that can be formed over conductive layer 116. The interconnect structure can also use bumps, bond wires, conductive paste, stud bump, micro bump, or other electrical interconnect. FIG. 3b shows bottom side redistribution interconnect structure 124 formed over carrier 110 as reconstituted panel or reconfigured wafer 122.

Bottom side redistribution interconnect structure 124 undergoes electrical testing and inspection as part of a quality control process. Manual visual inspection and automated optical systems are used to perform inspections on bottom side redistribution interconnect structure 124. Software can be used in the automated optical analysis of bottom side redistribution interconnect structure 124. Visual inspection methods may employ equipment such as a scanning electron microscope, high-intensity or ultra-violet light, or metallurgical microscope. Bottom side redistribution interconnect structure 124 is inspected for structural characteristics including warpage, thickness variation, surface particulates, irregularities, cracks, delamination, and discoloration.

The electrical connections within each unit 126 of bottom side redistribution interconnect structure 124 undergo testing at the carrier level for electrical performance and function. Each unit 126 is tested for functionality and electrical parameters, as shown in FIG. 3b, using a test probe head 128 including a plurality of probes or test leads 130, or other testing device. Probes 130 are used to make electrical contact with nodes or conductive pillars 120 on each unit 126 and provide electrical stimuli to RDL 116. Unit 126 responds to the electrical stimuli, which is measured by computer test system 132 and compared to an expected response to test functionality of the unit. The electrical tests may include functionality, lead integrity, resistivity, continuity, reliability, ESD, RF performance, and operational parameters specific to the component type. The inspection and electrical testing of bottom side redistribution interconnect structure 124 enables units 126 that pass to be designated as known good units (KGU) 134 for use in a semiconductor package. Units 126 that fail the inspection and test process are designated as rejected units 136. In one embodiment, rejected units 136 are marked for identification.

Figure 3C:
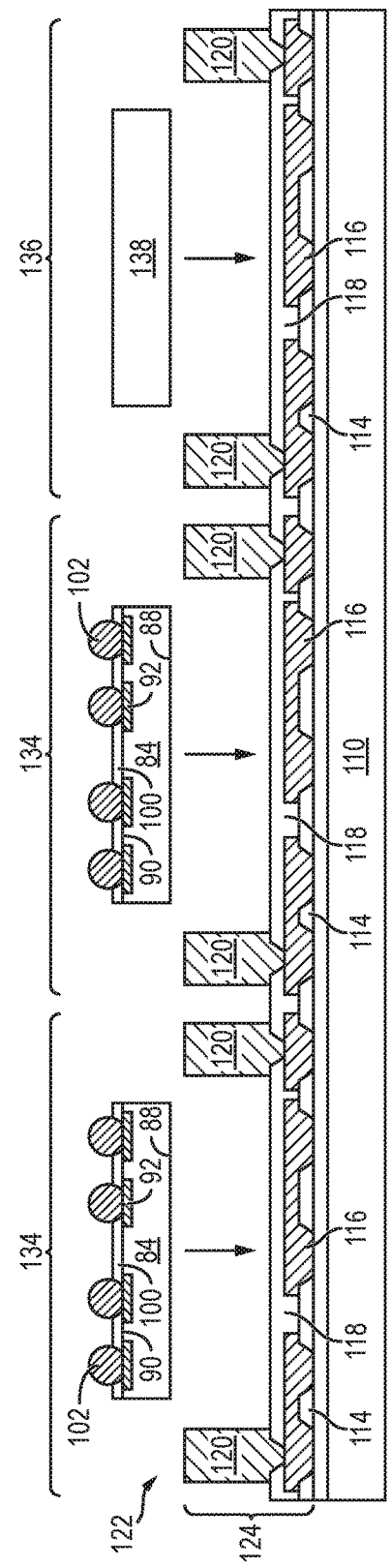

In FIG. 3c, KGD 84 from FIG. 2e are mounted to KGU 134 and over carrier 110 using, for example, a pick and place operation with back surface 88 of KGD 84 oriented toward the carrier. KGD 84 are not mounted to rejected units 136. Dummy die 138 are mounted over carrier 110 to rejected units 136 using, for example, a pick and place operation. Yield is improved because KGD 84 are only mounted to KGU 134 while dummy die 138 are mounted to rejected units 136. By testing units 126 prior to mounting KGD 84, mounting KGD to defective units 126 is avoided, increasing yield and decreasing KGD loss.

FIG. 3d shows KGD 84 and dummy die 138 mounted over KGU 134 and rejected units 136, respectively. An optional adhesive 140 is disposed between KGD 84 and KGU 134. Adhesive 140 includes a die attach adhesive, epoxy, or other adhesive material. In one embodiment, a top surface of conductive pillars 120 and a top surface of bumps 102 of KGD 84 are approximately coplanar.

In FIG. 3e, an encapsulant or molding compound 142 is deposited over reconstituted panel 122 including KGD 84, dummy die 138, and carrier 110 using a paste printing, compressive molding, transfer molding, liquid encapsulant molding, vacuum lamination, or other suitable applicator. Encapsulant 142 can be polymer composite material, such as epoxy resin with filler, epoxy acrylate with filler, or polymer with proper filler. Encapsulant 142 is non-conductive, provides physical support, and environmentally protects the semiconductor device from external elements and contaminants. Encapsulant 142 is deposited between conductive pillars 120 and KGD 84 to cover the side surfaces of conductive pillars 120 and KGD 84.

Figure 3F:
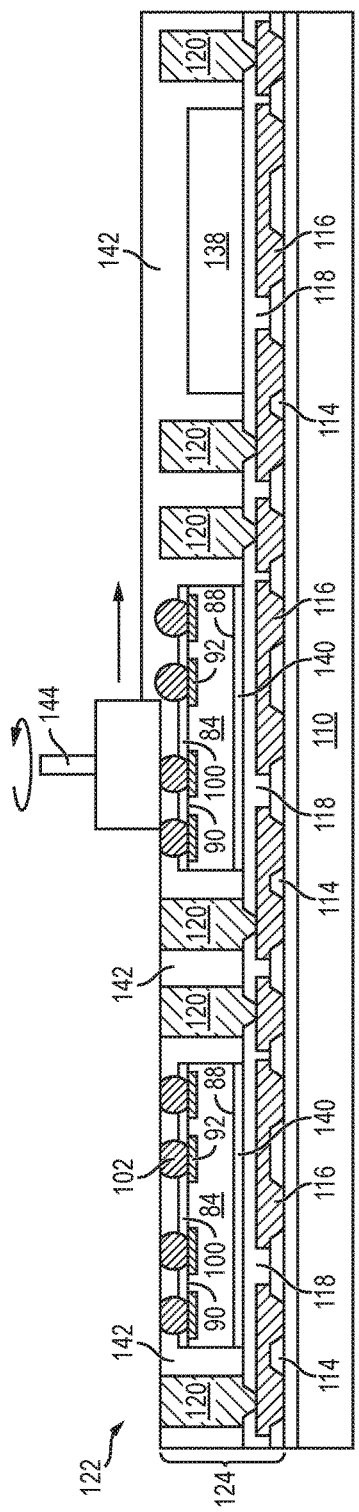

In FIG. 3f, a surface of encapsulant 142 undergoes a grinding operation with grinder 144 to planarize the surface and reduce a thickness of the encapsulant. The grinding operation removes encapsulant material to expose conductive pillars 120 and bumps 102. A chemical etch can also be used to remove and planarize encapsulant 142. After the grinding operation, a top surface of conductive pillars 120 and a top surface of bumps 102 of KGD 84 are coplanar with each other and with a top surface of encapsulant 142.

The method of fabricating 3D semiconductor packages continues with the simultaneous fabrication of the top side redistribution interconnect structure on a second manufacturing line, as shown in FIGS. 4a-4d, while bottom side redistribution interconnect structure 124 is being fabricated on the first manufacturing line, as shown in FIGS. 3a-3f, greatly reducing CT. The simultaneous fabrication of top and bottom side redistribution interconnect structures reduce CT and increase yield to reduce manufacturing costs.

Figure 4A:
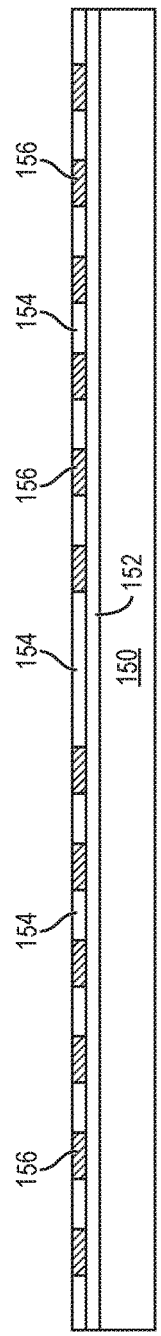

FIG. 4a shows a cross-sectional view of a portion of a carrier or temporary substrate 150 containing sacrificial base material such as silicon, polymer, beryllium oxide, glass, or other suitable low-cost, rigid material for structural support. An interface layer or double-sided tape 152 is formed over carrier 150 as a temporary adhesive bonding film, etch-stop layer, or thermal release layer.

Carrier 150 can be a round or rectangular panel (greater than 300 mm) with capacity for multiple semiconductor die 84. Carrier 150 may have a larger surface area than the surface area of semiconductor wafer 80. A larger carrier reduces the manufacturing cost of the semiconductor package as more components or semiconductor die can be processed on the larger carrier thereby reducing the cost per unit. Semiconductor packaging and processing equipment are designed and configured for the size of the wafer or carrier being processed.

To further reduce manufacturing costs, the size of carrier 150 is selected independent of the size of carrier 110, semiconductor die 84, or semiconductor wafer 80. That is, carrier 150 has a fixed or standardized size, which can accommodate various size semiconductor die 84 singulated from one or more semiconductor wafers 80. In one embodiment, carrier 150 is circular with a diameter of 330 mm. In another embodiment, carrier 150 is rectangular with a width of 560 mm and length of 600 mm. Accordingly, common or standardized carrier 150 lowers manufacturing costs and capital risk by reducing or eliminating the need for specialized semiconductor processing lines based on die size or incoming wafer size. By selecting a predetermined carrier size to use for any size component or semiconductor die from all semiconductor wafer sizes, a flexible manufacturing line can be implemented.

Figure 4B:
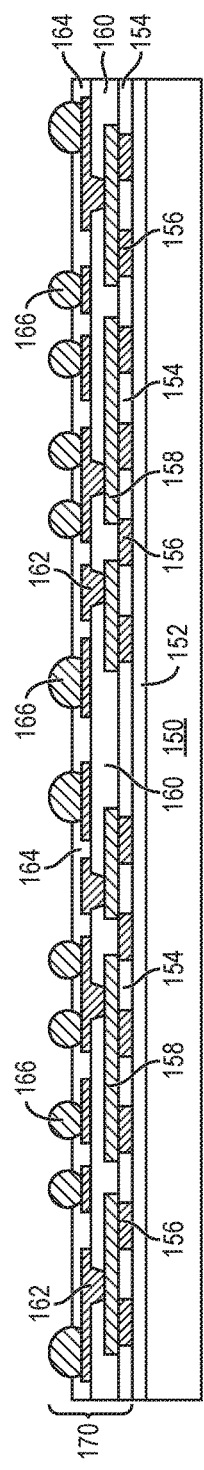

In FIGS. 4a-4b, a build-up interconnect structure 170 is formed over standardized carrier 150 and interface layer 152. Top side build-up interconnect structure 170 includes an insulating or passivation layer 154 formed over standardized carrier 150 and interface layer 152 using PVD, CVD, printing, spin coating, spray coating, sintering or thermal oxidation. The insulating layer 154 contains one or more layers of SiO2, Si3N4, SiON, Ta2O5, Al2O3, or other material having similar insulating and structural properties. A portion of insulating layer 154 is removed by an etching process to expose portions of interface layer 152. Top side build-up interconnect structure 170 also includes an electrically conductive layer or RDL 156 formed using a patterning and metal deposition process such as sputtering, electrolytic plating, and electroless plating. Conductive layer 156 can be one or more layers of Al, Cu, Sn, Ni, Au, Ag, or other suitable electrically conductive material. Portions of conductive layer 156 can be electrically common or electrically isolated depending on the design and function of the final semiconductor package.

FIG. 4b shows additional conductive layers 158 and 162 formed over insulating layer 154, conductive layer 156, and carrier 150. Electrically conductive layers 158 and 162 are formed using a patterning and metal deposition process such as sputtering, electrolytic plating, and electroless plating. Conductive layer 156 can be one or more layers of Al, Cu, Sn, Ni, Au, Ag, or other suitable electrically conductive material. Portions of conductive layers 158 and 162 can be electrically common or electrically isolated depending on the design and function of the final semiconductor package. Top side redistribution interconnect structure 170 further includes insulating or passivation layers 160 and 164, formed between the conductive layers for electrical isolation. Insulating layers 160 and 164 contain one or more layers of SiO2, Si3N4, SiON, Ta2O5, Al2O3, or other material having similar insulating and structural properties. Insulating layers 160 and 164 are formed using PVD, CVD, printing, spin coating, spray coating, sintering or thermal oxidation. A portion of insulating layer 160 is removed by an etching process to expose conductive layer 158 for additional package interconnect. A portion of insulating layer 164 is removed by an etching process to expose conductive layer 162 for bump formation or additional package interconnect.

An electrically conductive bump material is deposited over conductive layer 162 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 162 using a suitable attachment or bonding process. In one embodiment, the bump material is reflowed by heating the material above its melting point to form spherical balls or bumps 166. In some applications, bumps 166 are reflowed a second time to improve electrical contact to conductive layer 162. In one embodiment, bumps 166 are formed over a UBM having a wetting layer, barrier layer, and adhesive layer. The bumps 166 can also be compression bonded or thermocompression bonded to conductive layer 162. Bumps 166 represent one type of interconnect structure that can be formed over conductive layer 162. The interconnect structure can also use conductive pillars, bond wires, conductive paste, stud bump, micro bump, or other electrical interconnect.

FIG. 4c shows top side redistribution interconnect structure 180, similar to top side redistribution interconnect structure 170, with composite interconnect 182 in place of bumps 166. Composite interconnect 182 includes a non-fusible base 184 made of Cu, Au, Sn, Ni, and Pb, and a fusible cap 186 made of solder, Sn, or indium. The volume of fusible bump material in relation to the non-fusible base material is selected to ensure self-confinement by virtue of surface tension forces. During reflow, the fusible base material is self-confined around the non-fusible base material. The fusible bump material around the non-fusible base also maintains semiconductor die placement during reflow. In general, the height of composite interconnect 182 is the same or less than the diameter of the bump. In some cases, the height of composite interconnect 182 is greater than the diameter of the interconnect. In one embodiment, given a bump base diameter of 100 μm, the non-fusible base 184 is about 45 μm in height and the fusible cap 186 is about 35 μm in height.

In FIG. 4*d*, top side redistribution interconnect structure 170 from FIG. 4*b* undergoes electrical testing and inspection as part of a quality control process. Manual visual inspection and automated optical systems are used to perform inspections on top side redistribution interconnect structure 170. Software can be used in the automated optical analysis of top side redistribution interconnect structure 170. Visual inspection methods may employ equipment such as a scanning electron microscope, high-intensity or ultra-violet light, or metallurgical microscope. Top side redistribution interconnect structure 170 is inspected for structural characteristics including warpage, thickness variation, surface particulates, irregularities, cracks, delamination, and discoloration.

The electrical connections within each unit 190 of top side redistribution interconnect structure 170 undergo testing at the carrier level for electrical performance and circuit function. Each unit 190 is tested for functionality and electrical parameters, as shown in FIG. 4*d*, using a test probe head 192 including a plurality of probes or test leads 194, or other testing device. Probes 194 are used to make electrical contact with nodes or bumps 166 on each unit 190 and provide electrical stimuli to top side redistribution interconnect structure 170. Unit 190 responds to the electrical stimuli, which is measured by computer test system 196 and compared to an expected response to test functionality of the unit. The electrical tests may include functionality, lead integrity, resistivity, continuity, reliability, ESD, RF performance, and operational parameters specific to the component type. In one embodiment, the manufacturing of top side redistribution interconnect structure 170 requires a higher resolution than the manufacturing of bottom side redistribution interconnect structure 124.

As shown in FIG. 5*a*, the inspection and electrical testing of top side redistribution interconnect structure 170 enables units 190 that pass to be designated as KGU 200 for use in a semiconductor package. Units 190 that fail the inspection and test process are designated as rejected units 202. In one embodiment, rejected units 202 are marked for identification.

In FIG. 5*b*, top side redistribution interconnect structure 170 is singulated using a saw blade or laser cutting tool 204 into individual KGU 200 and rejected units 202. In one embodiment, carrier 150 is removed prior to singulation with saw blade or laser cutting tool 204. In one embodiment, rejected units 202 are discarded.

Figure 5C:
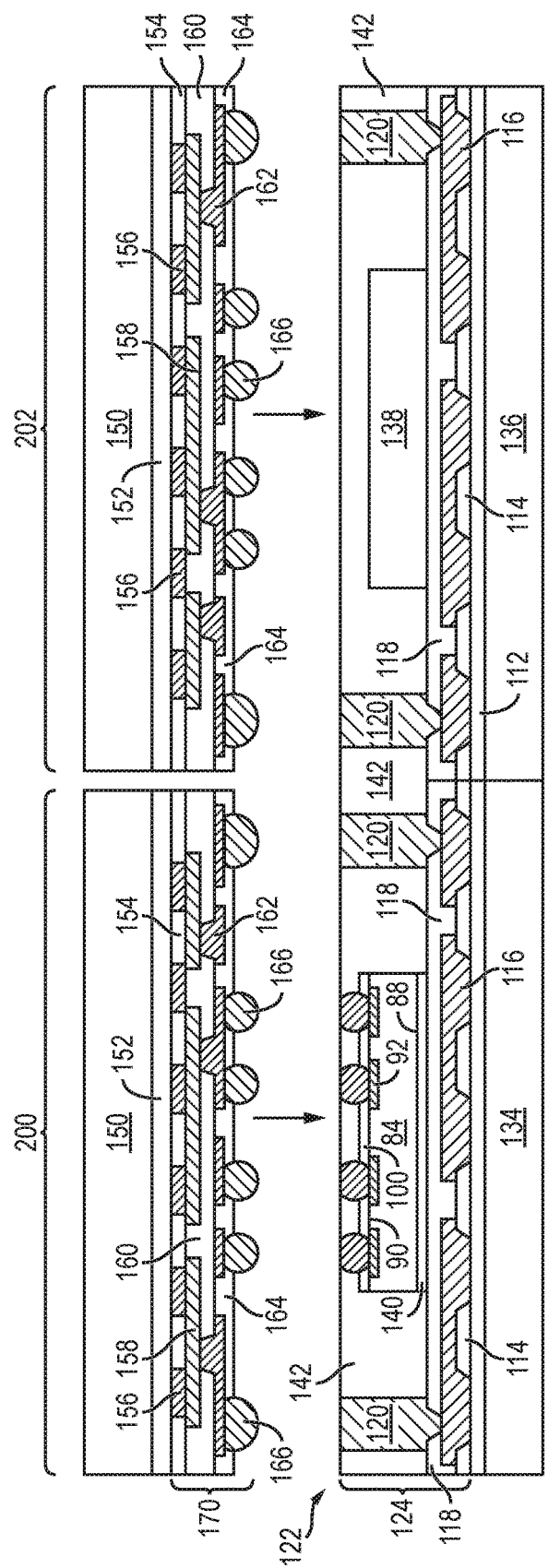

FIG. 5*c* shows KGU 200 from FIG. 5*b* mounted to KGU 134 and KGD 84 over carrier 110 and interface layer 112 using, for example, a pick and place operation with bumps 166 oriented toward the carrier and aligned with bumps 102 of KGD 84 and conductive pillars 120. FIG. 5*c* also shows rejected units 202 mounted to rejected units 136 and dummy die 138 over carrier 110 and interface layer 112 using, for example, a pick and place operation. By testing units 190 of top side redistribution interconnect structure 170 prior to mounting to KGD 84 and KGU 134 of bottom side redistribution interconnect structure 124, mounting a defective top side redistribution interconnect structure to KGD is avoided, increasing yield and decreasing KGD loss.

Figure 5D:
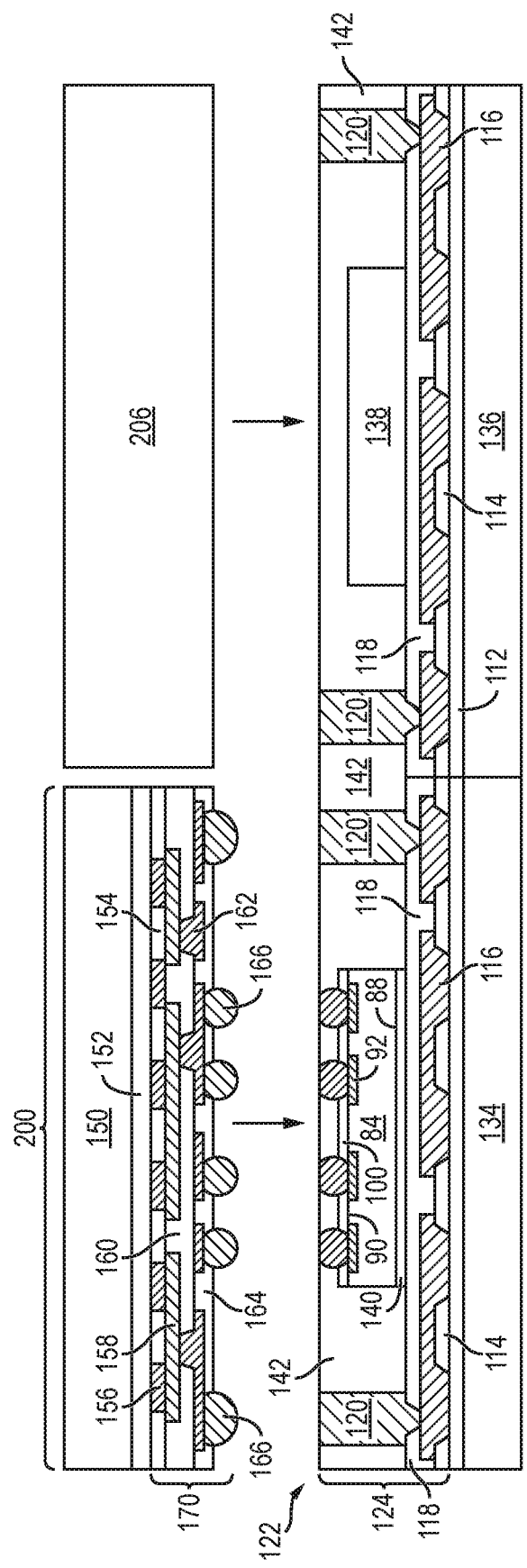

FIG. 5*d* shows optional dummy substrate 206 mounted to rejected units 136 and dummy die 138 over carrier 110 and interface layer 112 using, for example, a pick and place operation. In one embodiment, rejected units 136 and dummy die 138 are left uncovered, i.e., no dummy substrate 206 or rejected units 202 are disposed over rejected units 136. Yield is improved because only functional units 190 of top side redistribution interconnect structure 170 are mounted to KGD 84 and KGU 134 of bottom side redistribution interconnect structure 124. By testing units 190 of top side redistribution interconnect structure 170 prior to mounting to KGD 84 and KGU 134 of bottom side redistribution interconnect structure 124, mounting a defective top side redistribution interconnect structure to KGD is avoided, increasing yield and decreasing KGD loss.

Figure 5E:
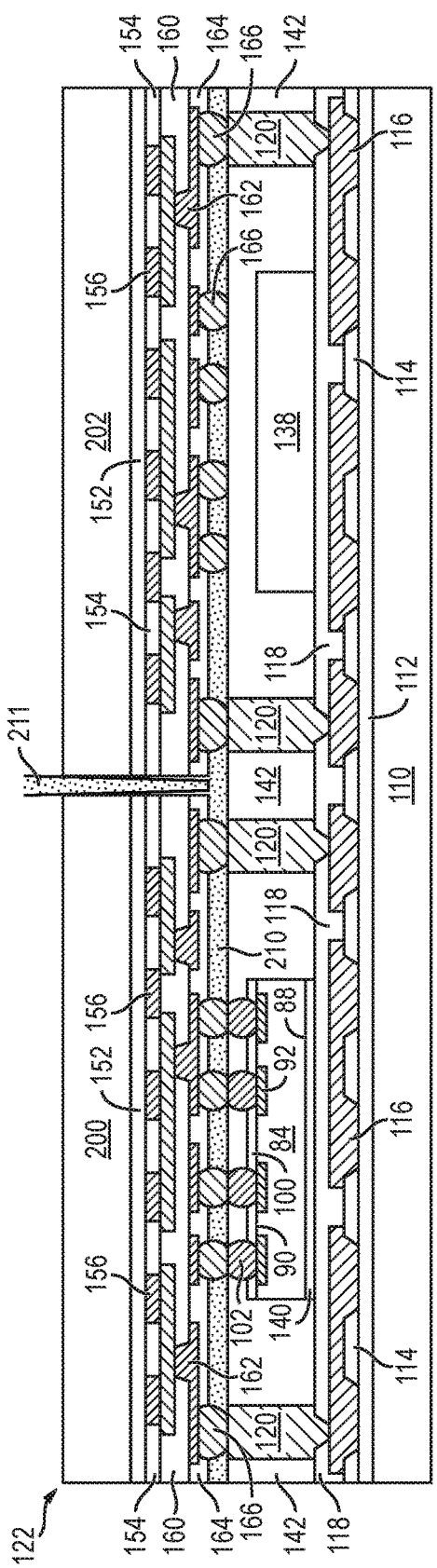

In FIG. 5*e*, an optional underfill material 210 is deposited between reconstituted panel 122 and KGU 200 of top side redistribution interconnect structure 170 using dispensing needle 211. Underfill materials include epoxy, epoxy-resin adhesive material, polymeric materials, films, or other non-conductive materials. Underfill 210 is non-conductive and environmentally protects the semiconductor device from external elements and contaminants.

FIG. 5*f* shows a plan view of a portion of reconstituted panel 122 including KGU 134 and rejected units 136 of bottom side redistribution interconnect structure 124 encapsulated with encapsulant 142.

FIG. 5*g* shows a plan view of a portion of reconstituted panel 122 including KGU 200 of top side redistribution interconnect structure 170 disposed over KGU 134 and KGD 84. Rejected units 202 of top side redistribution interconnect structure 170 are disposed over rejected units 136 and dummy die 138. In one embodiment, underfill 210 is a capillary underfill (CAF) and FIG. 5*g* shows the pattern of dispense locations for CAF 210. In another embodiment, underfill 210 is a molded underfill (MUF). MUF 210 can be pumped from a reservoir to dispensing needle 211 located according to the dispensing pattern shown in FIG. 5*g*. MUF 210 is injected under pressure from dispensing needle 211 between reconstituted panel 122 and KGU 200 of top side redistribution interconnect structure 170. A vacuum assist can draw MUF 210 to aid with uniform distribution. MUF 210 can be polymer composite material, such as epoxy resin with filler, epoxy acrylate with filler, or polymer with proper filler.

Figure 5H:
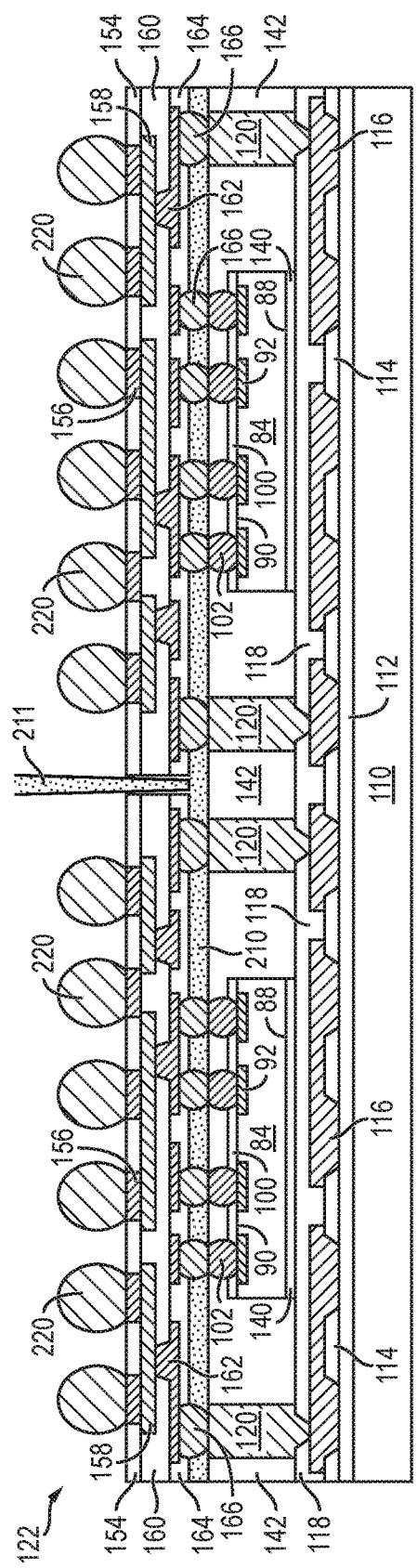

In FIG. 5*h*, temporary carrier 150 and optional interface layer 152 are removed from KGU 200 by chemical etching, mechanical peel-off, chemical mechanical planarization (CMP), mechanical grinding, thermal bake, laser scanning, or wet stripping. Insulating layer 154 and conductive layer 156 of KGU 200 are exposed after carrier 150 and interface layer 152 are removed.

An electrically conductive bump material is deposited over conductive layer 156 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 156 using a suitable attachment or bonding process. In one embodiment, the bump material is reflowed by heating the material above its melting point to form spherical balls or bumps 220. In some applications, bumps 220 are reflowed a second time to improve electrical contact to conductive layer 156. In one embodiment, bumps 220 are formed over a UBM having a wetting layer, barrier layer, and adhesive layer. The bumps 220 can also be compression bonded or thermocompression bonded to conductive layer 156. Bumps 220 represent one type of interconnect structure that can be formed over conductive layer 156. The interconnect structure can also use conductive pillars, bond wires, conductive paste, stud bump, micro bump, or other electrical interconnect.

Figure 5I:
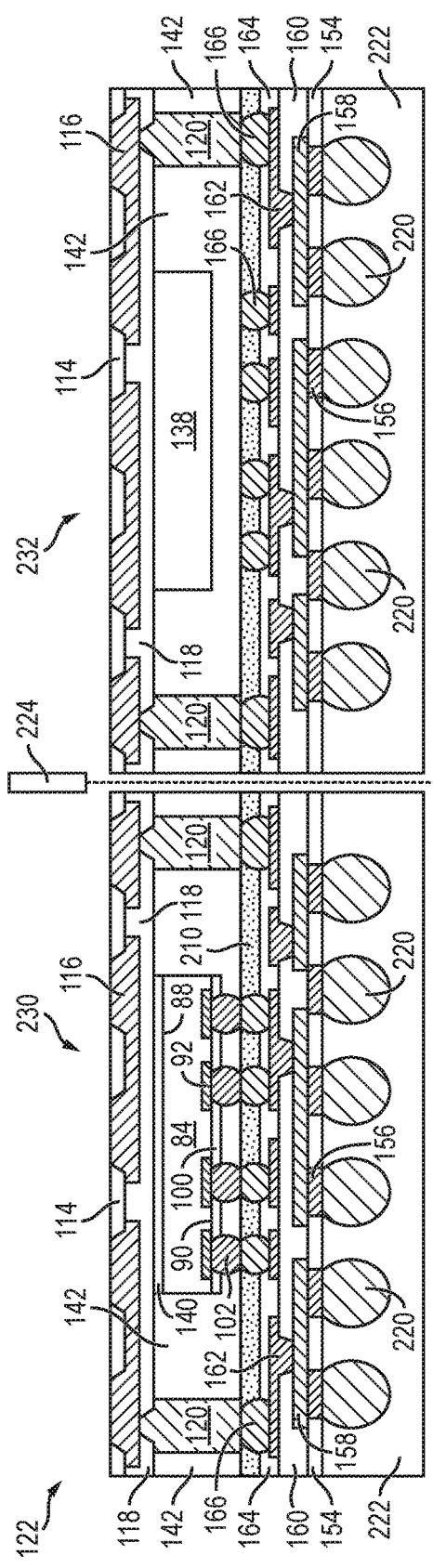

In FIG. 5*i*, an optional backgrinding tape or support tape 222 is applied over reconstituted panel 122 and in contact with interconnect structure 220. In one embodiment, support tape 222 includes a thermally resistant tape, warpage balancing tape, or other tape. For example, support tape 222 may include a material having high thermal conductivity and high heat resistance. Alternatively, reconstituted panel 122 is placed in a supporting jig with or without support tape 222.

In FIG. 5*i*, temporary carrier 110 and optional interface layer 112 are removed from reconstituted panel 122 by chemical etching, mechanical peel-off, CMP, mechanical grinding, thermal bake, laser scanning, or wet stripping. Insulating layer 114 and conductive layer 116 of KGU 134 are exposed after carrier 110 and interface layer 112 are removed. In FIG. 5*i*, reconstituted panel 122 is singulated using a saw blade or laser cutting tool 224 into individual 3D fan-out dual side RDL WLCSP 230 and rejected units 232. In one embodiment, carrier 110 and interface layer 112 are removed prior to singulation with saw blade or laser cutting tool 224.

Figure 6:
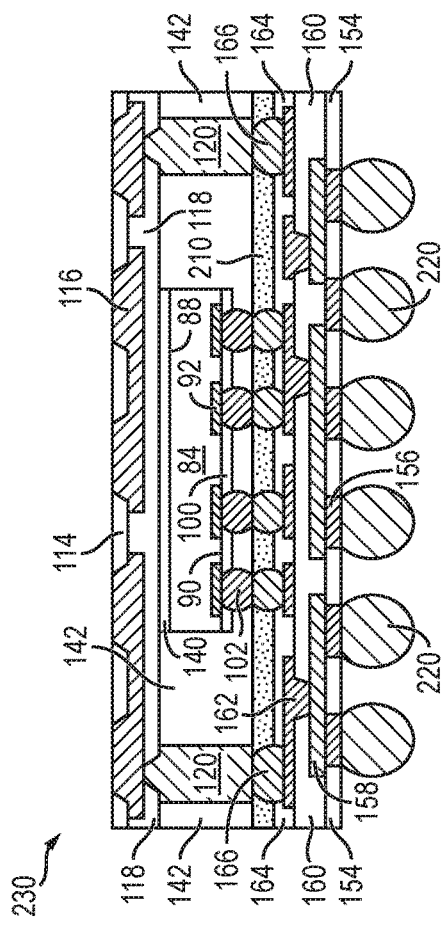
FIG. 6 illustrates a 3D fan-out dual side RDL WLCSP.

FIG. 6 shows 3D fan-out dual side RDL WLCSP 230. Bottom side redistribution interconnect structure 124 and top side redistribution interconnect structure 170 are processed on different temporary or sacrificial carriers, on different manufacturing lines, and are processed at the same time, i.e., simultaneously, to shorten overall manufacturing time, or CT. In one embodiment, bottom side redistribution interconnect structure 124 is manufactured using a lower resolution, e.g., 250 nanometers (nm), while top side redistribution interconnect structure 170 is manufactured using a higher resolution, e.g., 90 nm resolution. The higher resolution manufacturing line is more costly than the lower resolution manufacturing line. Accordingly, producing bottom side redistribution interconnect structure 124 on the higher resolution manufacturing line is wasteful. Bottom side redistribution interconnect structure 124 and top side redistribution interconnect structure 170 are processed on different manufacturing lines using different technology nodes, increasing efficiency. Semiconductor die 84, bottom side redistribution interconnect structure 124, and top side redistribution interconnect structure 170 are each fully tested prior to assembly. By testing semiconductor die 84, bottom side redistribution interconnect structure 124, and top side redistribution interconnect structure 170, only known good die and known good RDL's are combined, increasing yield and decreasing KGD loss. Accordingly, 3D fan-out dual side RDL WLCSP 230 is produced with shorter CT, higher yield, increased efficiency, and reduced KGD loss. The ability to produce 3D fan-out dual side RDL WLCSP 230 with reduced CT allows for less inventory storage, further reducing loss to obsolesce of stored inventory.

Figure 7:
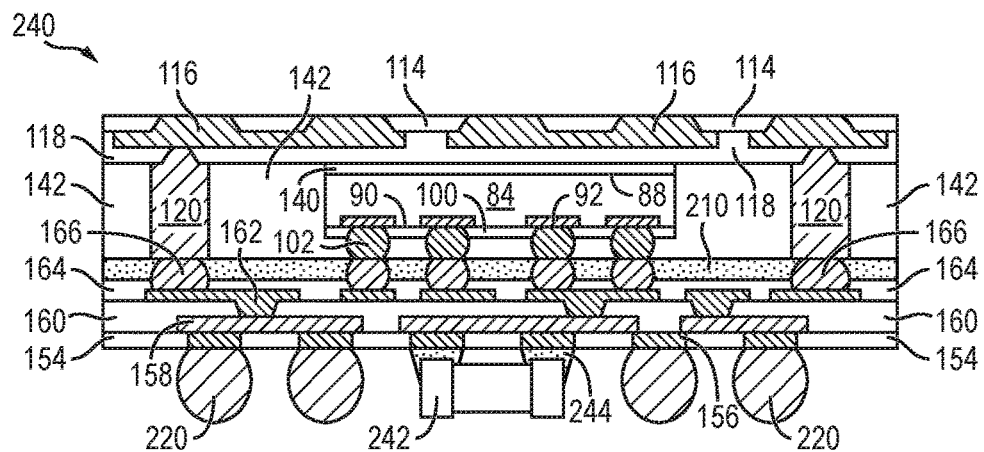
FIG. 7 illustrates another 3D fan-out dual side RDL WLCSP including a discrete passive device.

FIG. 7 shows 3D fan-out dual side RDL WLCSP 240, similar to 3D fan-out dual side RDL WLCSP 230. 3D fan-out dual side RDL WLCSP 240 is manufactured using the same method of forming a 3D semiconductor package with short cycle time and high yield shown in FIGS. 3*a*-5*i*. 3D fan-out dual side RDL WLCSP 240 enjoys all of the benefits of 3D fan-out dual side RDL WLCSP 230, including reduced CT, increased yield, increased efficiency, and reduced loss to obsolesce of stored inventory. 3D fan-out dual side RDL WLCSP 240 also includes discrete passive device 242 mounted to KGU 200 of top side redistribution interconnect structure 170 using adhesive 244. Adhesive 244 can be thermal epoxy, epoxy resin, B-stage epoxy laminating film, ultra violet (UV) B-stage film adhesive layer, UV B-stage film adhesive layer including acrylic polymer 154, thermo-setting adhesive film layer, wire-in-film (WIF) encapsulant material, a suitable wafer backside coating, epoxy resin with organic filler, silica filler, or polymer filler, acrylate based adhesive, epoxy-acrylate adhesive, or a PI-based adhesive. Adhesive 244 is generally only minimally conductive. In some embodiments, adhesive 244 includes a non-conductive material. Passive 242 is mounted to KGU 200 of top side redistribution interconnect structure 170 after formation of bumps 220. Next, optional backgrinding tape or support tape 222 is applied over reconstituted panel 122 and in contact with interconnect structure 220 and passive 242.

Figure 8A:
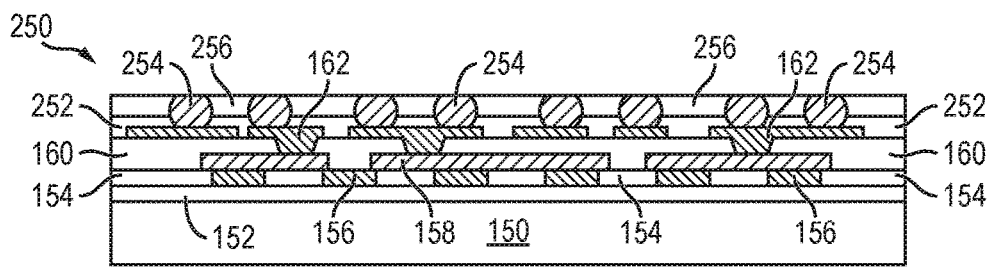
FIGS. 8a-8b illustrate a 3D fan-out dual side RDL WLCSP with an alternate top side redistribution interconnect structure.

FIG. 8*a* shows top side redistribution interconnect structure 250, similar to top side redistribution interconnect structure 170. Top side redistribution interconnect structure 250 also includes multiple interconnects or bumps 254 in place of bumps 166 in top side redistribution interconnect structure 170. A plurality of bumps 254 is configured to contact each conductive pillar 120. An insulating or passivation layer 256 is formed over reconstituted panel 122 and bumps 254 using PVD, CVD, printing, spin coating, spray coating, sintering or thermal oxidation. Insulating layer 256 contains one or more layers of $SiO_2$, $Si_3N_4$, SiON, $Ta_2O_5$, $Al_2O_3$, or other material having similar insulating and structural properties. A portion of insulating layer 256 is removed by an etching process to expose bumps 254.

Figure 8B:
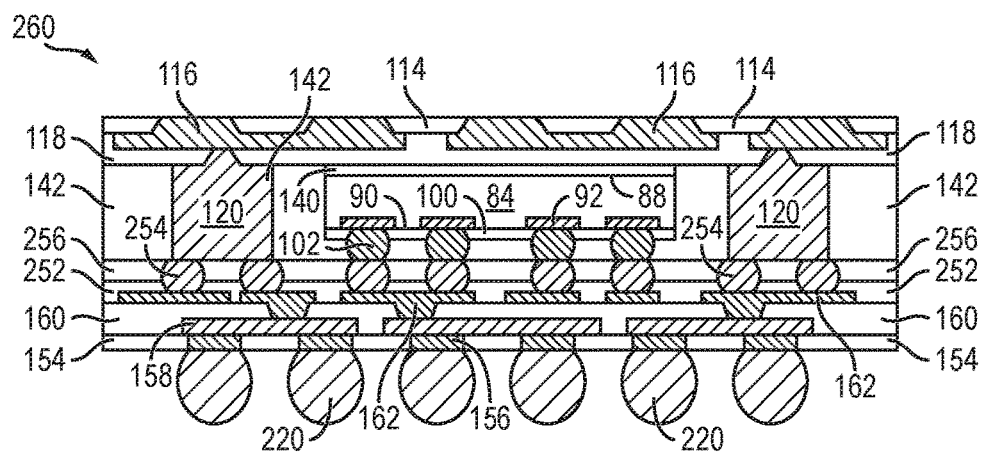

FIG. 8*b* shows 3D fan-out dual side RDL WLCSP 260, similar to 3D fan-out dual side RDL WLCSP 230. 3D fan-out dual side RDL WLCSP 260 is manufactured using the same method of forming a 3D semiconductor package with short cycle time and high yield shown in FIGS. 3*a*-5*i*, with top side redistribution interconnect structure 250 in place of top side redistribution interconnect structure 170. 3D fan-out dual side RDL WLCSP 260 enjoys all of the benefits of 3D fan-out dual side RDL WLCSP 230, including reduced CT, increased yield, increased efficiency, and reduced loss to obsolesce of stored inventory.

Figure 9:
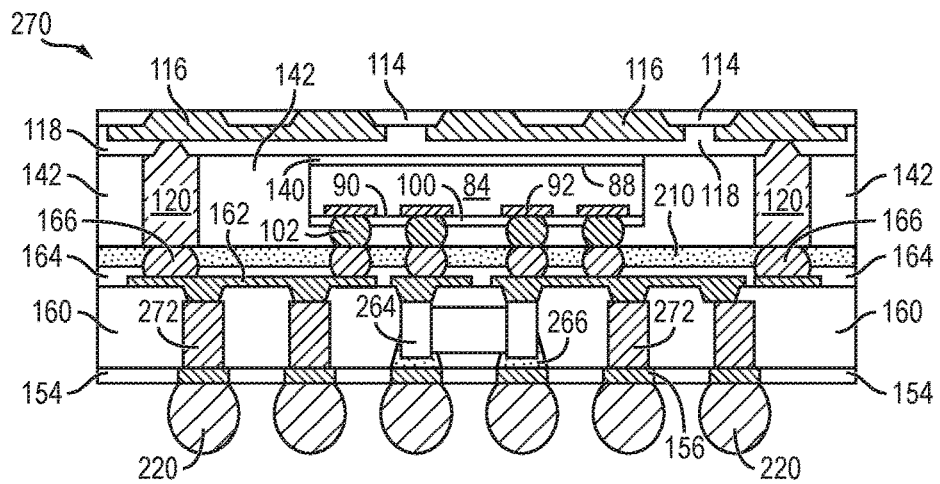
FIG. 9 illustrates another 3D fan-out dual side RDL WLCSP including a discrete passive device.

FIG. 9 shows 3D fan-out dual side RDL WLCSP 270, similar to 3D fan-out dual side RDL WLCSP 230. 3D fan-out dual side RDL WLCSP 270 is manufactured using the same method of forming a 3D semiconductor package with short cycle time and high yield shown in FIGS. 3*a*-5*i*. 3D fan-out dual side RDL WLCSP 270 enjoys all of the benefits of 3D fan-out dual side RDL WLCSP 230, including reduced CT, increased yield, increased efficiency, and reduced loss to obsolesce of stored inventory. 3D fan-out dual side RDL WLCSP 270 also includes discrete passive device 264 embedded in top side redistribution interconnect structure 170 and bonded to conductive layer 156 using adhesive 266. Adhesive 266 can be thermal epoxy, epoxy resin, B-stage epoxy laminating film, UV B-stage film adhesive layer, UV B-stage film adhesive layer including acrylic polymer 154, thermo-setting adhesive film layer, WIF encapsulant material, a suitable wafer backside coating, epoxy resin with organic filler, silica filler, or polymer filler, acrylate based adhesive, epoxy-acrylate adhesive, or a PI-based adhesive. Adhesive 266 is generally only minimally conductive. In some embodiments, adhesive 266 includes a non-conductive material. 3D fan-out dual side RDL WLCSP 270 also includes conductive pillars 272, similar to conductive pillars 120, formed between conductive layers 156 and 162.

Figure 10:
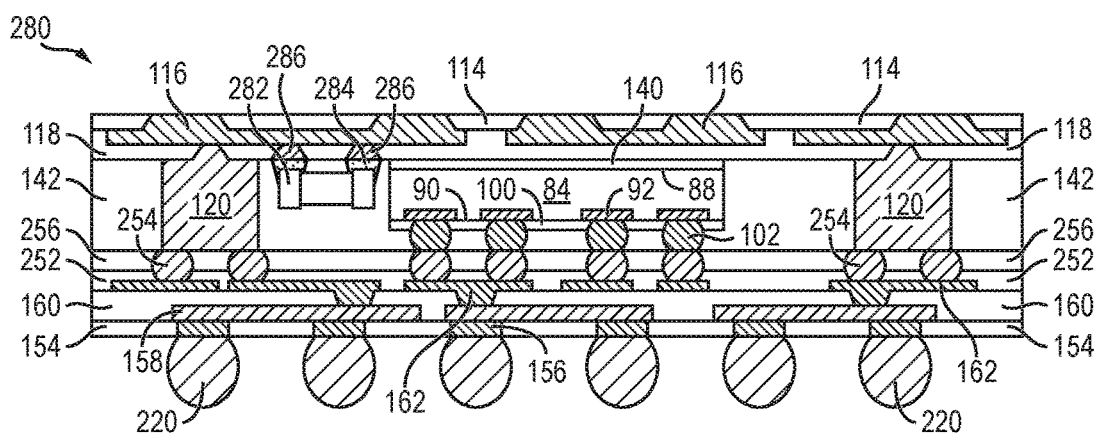
FIG. 10 illustrates a 3D fan-out dual side RDL WLCSP with an alternate top side redistribution interconnect structure and a discrete passive device.

FIG. 10 shows 3D fan-out dual side RDL WLCSP 280, similar to 3D fan-out dual side RDL WLCSP 260. 3D fan-out dual side RDL WLCSP 280 is manufactured using the same method of forming a 3D semiconductor package with short cycle time and high yield shown in FIGS. 3*a*-5*i*, with top side redistribution interconnect structure 250 in place of top side redistribution interconnect structure 170. 3D fan-out dual side RDL WLCSP 280 enjoys all of the benefits of 3D fan-out dual side RDL WLCSP 230, including reduced CT, increased yield, increased efficiency, and reduced loss to obsolesce of stored inventory. 3D fan-out dual side RDL WLCSP 280 also includes discrete passive device 282 disposed over bottom side redistribution interconnect structure 124 and bonded to conductive layer 286 using adhesive 284. Adhesive 284 can be thermal epoxy, epoxy resin, B-stage epoxy laminating film, UV B-stage film adhesive layer, UV B-stage film adhesive layer including acrylic polymer 154, thermo-setting adhesive film layer, WIF encapsulant material, a suitable wafer backside coating, epoxy resin with organic filler, silica filler, or polymer filler, acrylate based adhesive, epoxy-acrylate adhesive, or a PI-based adhesive. Adhesive 284 is generally only minimally conductive. In some embodiments, adhesive 284 includes a non-conductive material. Conductive layer 286 is formed by depositing conductive material in vias in insulating layer 118. Conductive layer 286 can be one or more layers of Al, Cu, Sn, Ni, Au, Ag, or other suitable electrically conductive material, such as the conductive material used to form conductive pillars 120. Conductive layer 286 may be formed at the same time and in the same manner as conductive pillars 120.

Figure 11:
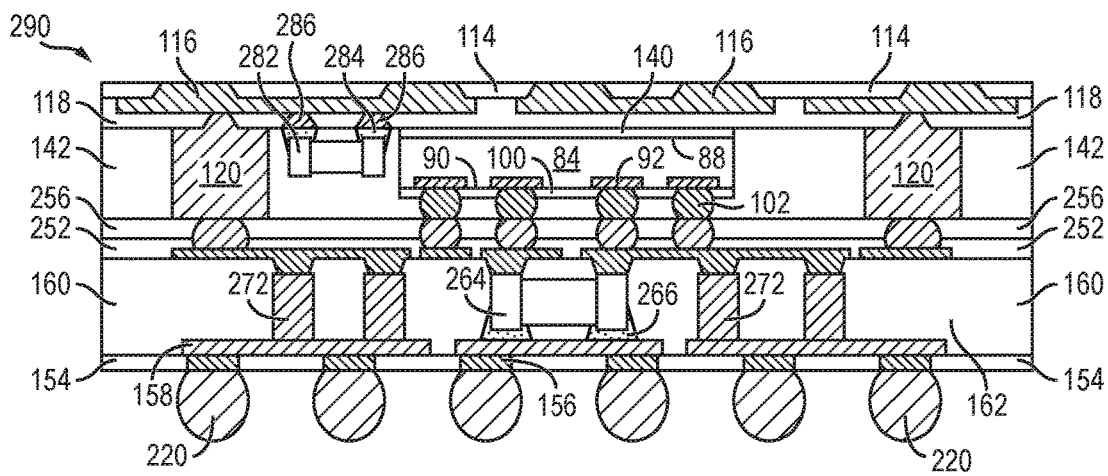
FIG. 11 illustrates another 3D fan-out dual side RDL WLCSP including two discrete passive devices.

FIG. 11 shows 3D fan-out dual side RDL WLCSP 290, similar to 3D fan-out dual side RDL WLCSP 230. 3D fan-out dual side RDL WLCSP 290 is manufactured using the same method of forming a 3D semiconductor package with short cycle time and high yield shown in FIGS. 3a-5i. 3D fan-out dual side RDL WLCSP 290 enjoys all of the benefits of 3D fan-out dual side RDL WLCSP 230, including reduced CT, increased yield, increased efficiency, and reduced loss to obsolesce of stored inventory. 3D fan-out dual side RDL WLCSP 290 also includes discrete passive device 264 embedded in top side redistribution interconnect structure 170 and bonded to conductive layer 156 using adhesive 266. 3D fan-out dual side RDL WLCSP 290 also includes conductive pillars 272, similar to conductive pillars 120, formed between conductive layers 156 and 162. 3D fan-out dual side RDL WLCSP 290 also includes discrete passive device 282 disposed over bottom side redistribution interconnect structure 124 and bonded to conductive layer 286 using adhesive 284. Adhesive 284 can be thermal epoxy, epoxy resin, B-stage epoxy laminating film, UV B-stage film adhesive layer, UV B-stage film adhesive layer including acrylic polymer 154, thermo-setting adhesive film layer, WIF encapsulant material, a suitable wafer backside coating, epoxy resin with organic filler, silica filler, or polymer filler, acrylate based adhesive, epoxy-acrylate adhesive, or a PI-based adhesive. Adhesive 284 is generally only minimally conductive. In some embodiments, adhesive 284 includes a non-conductive material. Conductive layer 286 is formed by depositing conductive material in vias in insulating layer 118. Conductive layer 286 can be one or more layers of Al, Cu, Sn, Ni, Au, Ag, or other suitable electrically conductive material, such as the conductive material used to form conductive pillars 120. Conductive layer 286 may be formed at the same time and in the same manner as conductive pillars 120.

Figure 12:
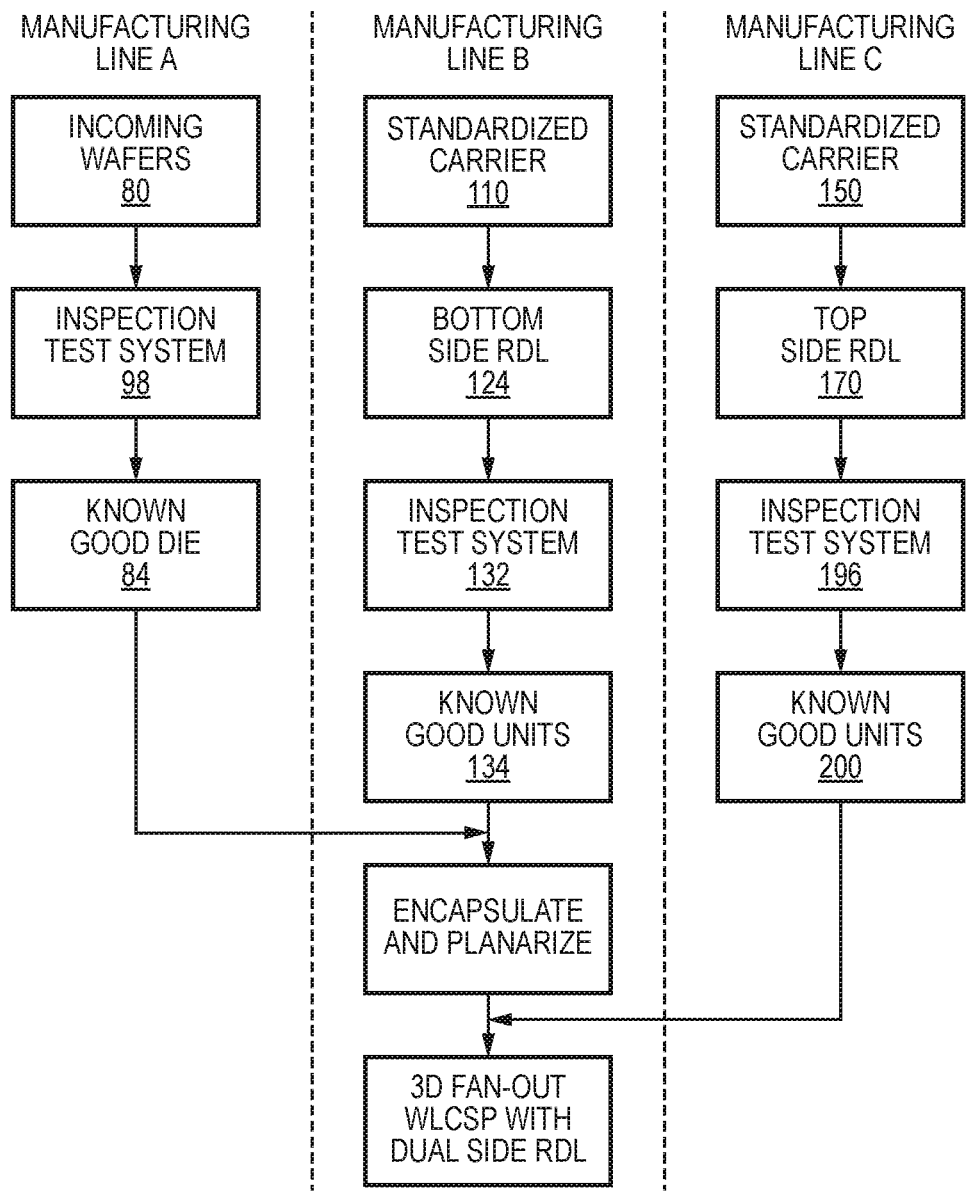
FIG. 12 illustrates a process of forming a 3D fan-out dual side RDL WLCSP.

FIG. 12 summarizes the method of forming a 3D semiconductor package with short cycle time and high yield shown in FIGS. 3a-5i. In particular, FIG. 12 illustrates how three different manufacturing lines are used at the same time, i.e., simultaneously, to greatly reduce CT for producing a 3D fan-out dual side RDL WLCSP. Additionally, FIG. 12 illustrates how three different intermediate inspecting and testing protocols are used at intermediate stages of production to greatly increase yield and decrease loss of KGD 84 for producing a 3D fan-out dual side RDL WLCSP. The method of forming a 3D semiconductor package with short cycle time and high yield shown in FIG. 12 can be used to manufacture any of the 3D fan-out dual side RDL WLCSPs discussed above, including 3D fan-out dual side RDL WLCSP 230, 3D fan-out dual side RDL WLCSP 240, 3D fan-out dual side RDL WLCSP 260, 3D fan-out dual side RDL WLCSP 270, 3D fan-out dual side RDL WLCSP 280, or 3D fan-out dual side RDL WLCSP 290. Incoming semiconductor wafers 80 are processed, inspected, and diced on manufacturing line A. Insulating layer 100 and bumps 102 are formed on manufacturing line A. Bottom side redistribution interconnect structure 124 is fabricated and inspected on manufacturing line B. Top side redistribution interconnect structure 170 is fabricated, inspected, and diced on manufacturing line C. Bottom side redistribution interconnect structure 124 and top side redistribution interconnect structure 170 are fabricated on different temporary or sacrificial carriers, and are processed at the same time, i.e., simultaneously, to shorten overall manufacturing time, or CT. Manufacturing lines A, B, and C all run simultaneously to produce the 3D fan-out dual side RDL WLCSP, reducing CT. In one embodiment, bottom side redistribution interconnect structure 124 is manufactured using a lower resolution, e.g., 250 nm, while top side redistribution interconnect structure 170 is manufactured using a higher resolution, e.g., 90 nm resolution. In one embodiment, manufacturing line B possesses a lower resolution, e.g., 250 nm, while manufacturing line C possesses a higher, i.e., greater, resolution, e.g., 90 nm resolution. The higher resolution manufacturing line is more costly to operate than the lower resolution manufacturing line. Accordingly, fabricating bottom side redistribution interconnect structure 124 on the higher resolution manufacturing line is wasteful. The method of forming a 3D semiconductor package with short cycle time and high yield shown in FIG. 12 eliminates such waste. Bottom side redistribution interconnect structure 124 and top side redistribution interconnect structure 170 are processed on different manufacturing lines using different technology nodes, increasing efficiency. Semiconductor die 84, bottom side redistribution interconnect structure 124, and top side redistribution interconnect structure 170 are each fully tested prior to assembly. By testing semiconductor die 84, bottom side redistribution interconnect structure 124, and top side redistribution interconnect structure 170, only known good die and known good RDLs are combined, increasing yield and decreasing KGD loss. Accordingly, 3D fan-out dual side RDL WLCSP 230 is produced with shorter CT, higher yield, increased efficiency, and reduced KGD loss. The ability to produce a 3D fan-out dual side RDL WLCSP with reduced CT allows for less inventory storage, further increasing efficiency by reducing loss to obsolesce of stored inventory.

Figure 13A:
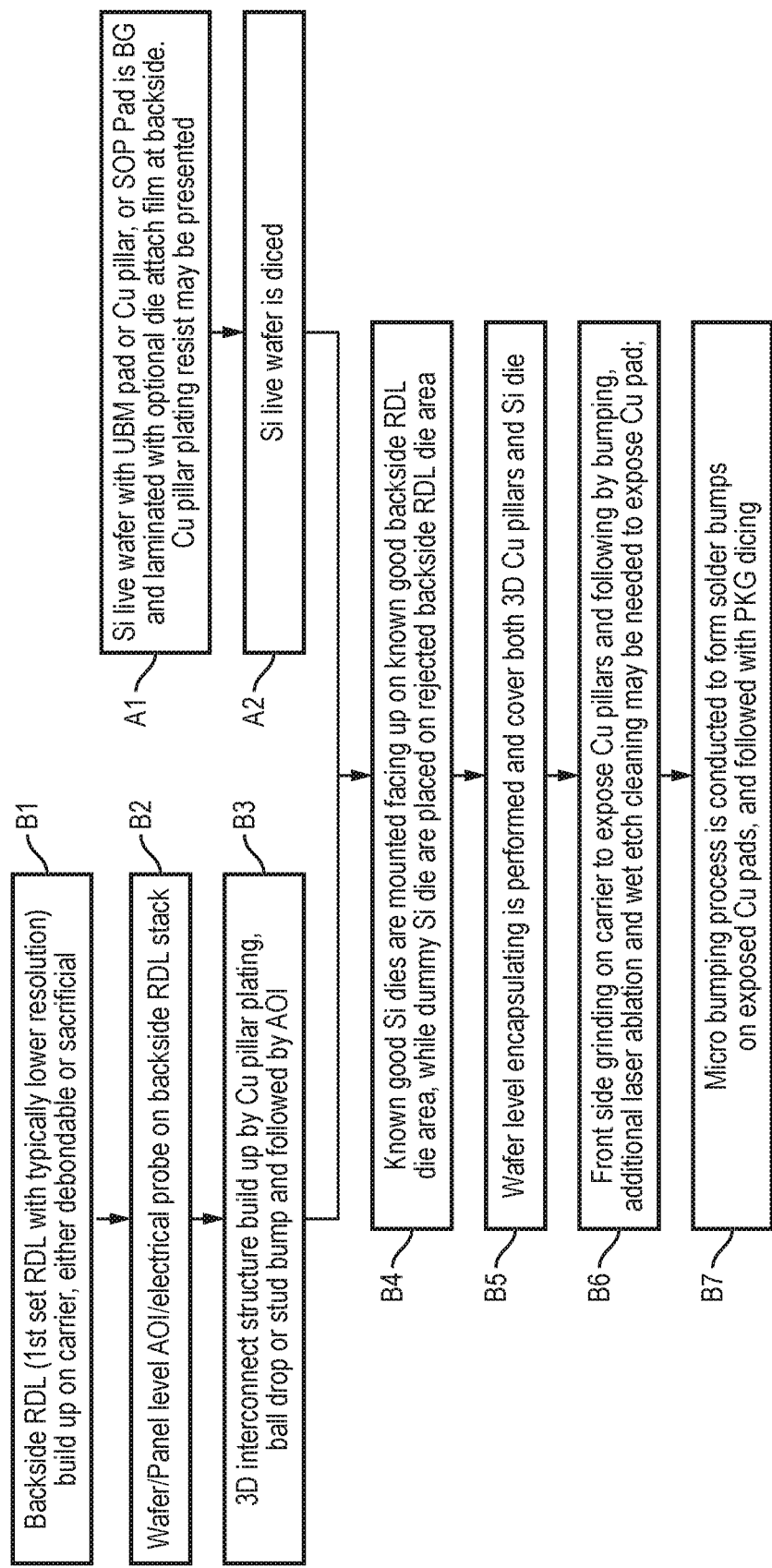

FIGS. 13a-13b show an optional process flow.

While one or more embodiments of the present invention have been illustrated in detail, the skilled artisan will appreciate that modifications and adaptations to those embodiments may be made without departing from the scope of the present invention as set forth in the following claims.

What is claimed:
1. A method of making a semiconductor device, comprising:
providing a first manufacturing line;
providing a second manufacturing line;

forming a first redistribution interconnect structure using the first manufacturing line;
forming a second redistribution interconnect structure using the second manufacturing line;
testing a first unit of the first redistribution interconnect structure to determine a first known good unit (KGU);
disposing a known good semiconductor die (KGD) over the first KGU of the first redistribution interconnect structure after determining the first KGU;
testing a unit of the second redistribution interconnect structure to determine a second known good unit (KGU); and
disposing the second KGU of the second redistribution interconnect structure over the first KGU of the first redistribution interconnect structure and the KGD.

2. The method of claim 1, further including:
providing a third manufacturing line;
testing a semiconductor die of a semiconductor wafer to determine the KGD; and
dicing the KGD from the semiconductor wafer using the third manufacturing line.

3. The method of claim 1, further including:
testing a second unit of the first redistribution interconnect structure to determine a rejected unit; and
disposing a dummy die over the rejected unit of the first redistribution interconnect structure.

4. The method of claim 1, wherein forming the second redistribution interconnect structure further includes disposing a discrete passive device over a conductive layer of the second redistribution interconnect structure.

5. The method of claim 1, wherein a resolution of the second manufacturing line used in forming the second redistribution interconnect structure is greater than a resolution of the first manufacturing line used in forming the first redistribution interconnect structure.

6. The method of claim 1, further including disposing the second KGU of the second redistribution interconnect structure over the KGD opposite the first KGU of the first redistribution interconnect structure.

7. A method of making a semiconductor device, comprising:
providing a first manufacturing line;
forming a first redistribution interconnect structure using the first manufacturing line;
testing a first unit of the first redistribution interconnect structure to determine a first known good unit (KGU); and
disposing a known good semiconductor die (KGD) over the first KGU of the first redistribution interconnect structure.

8. The method of claim 7, further including:
providing a third manufacturing line;
testing a semiconductor die of a semiconductor wafer to determine the KGD; and
dicing the KGD from the semiconductor wafer using the third manufacturing line.

9. The method of claim 7, further including:
testing a second unit of the first redistribution interconnect structure to determine a rejected unit; and
disposing a dummy die over the rejected unit of the first redistribution interconnect structure.

10. The method of claim 7, further including forming a second redistribution interconnect structure using a second manufacturing line simultaneously with forming the first redistribution interconnect structure, wherein a resolution of the second manufacturing line is different than a resolution of the first manufacturing line.

11. The method of claim 10, wherein forming the second redistribution interconnect structure includes using a resolution greater than the resolution of the first manufacturing line.

12. The method of claim 7, further including disposing a discrete passive device over the first redistribution interconnect structure.

13. The method of claim 7, further including:
forming a second redistribution interconnect structure using a second manufacturing line;
testing a unit of the second redistribution interconnect structure to determine a second known good unit (KGU); and
disposing the second KGU of the second redistribution interconnect structure over the first KGU of the first redistribution interconnect structure and the KGD.

14. The method of claim 7, further including:
forming a plurality of conductive pillars over the first redistribution interconnect structure; and
disposing the KGD between the plurality of conductive pillars.

15. A method of making a semiconductor device, comprising:
forming a first redistribution interconnect structure using a first manufacturing line;
forming a second redistribution interconnect structure using a second manufacturing line;
testing a second unit of the first redistribution interconnect structure to determine a rejected unit; and
disposing a dummy die over the rejected unit of the first redistribution interconnect structure.

16. The method of claim 15, further including:
testing a first unit of the first redistribution interconnect structure to determine a first known good unit (KGU); and
disposing a known good semiconductor die (KGD) over the first KGU of the first redistribution interconnect structure.

17. The method of claim 16, further including:
testing a unit of the second redistribution interconnect structure to determine a second known good unit (KGU); and
disposing the second KGU of the second redistribution interconnect structure over the first KGU of the first redistribution interconnect structure and the KGD.

18. The method of claim 17, further including:
providing a third manufacturing line;
testing a semiconductor die of a semiconductor wafer to determine the KGD; and
dicing the KGD from the semiconductor wafer using the third manufacturing line.

19. The method of claim 15, wherein forming the second redistribution interconnect structure further includes disposing a discrete passive device over a conductive layer of the second redistribution interconnect structure.

20. The method of claim 15, wherein a resolution of the second manufacturing line is different than a resolution of the first manufacturing line.

21. The method of claim 20, wherein forming the second redistribution interconnect structure includes using a resolution greater than the resolution of the first manufacturing line.

* * * * *